United States Patent [19]
Horiguchi et al.

[11] Patent Number: 6,013,356
[45] Date of Patent: Jan. 11, 2000

[54] CIRCUIT BOARD WITH HIGH STRENGTH AND HIGH RELIABILITY AND PROCESS FOR PREPARING THE SAME

[75] Inventors: Akihiro Horiguchi, Kanagawa-ken; Hiroyasu Sumino, Tokyo; Mitsuo Kasori, Kanagawa-ken; Fumio Ueno, Tokyo, all of Japan

[73] Assignee: Kabushiki Kaisha Toshiba, Kawasaki, Japan

[21] Appl. No.: 08/721,319

[22] Filed: Sep. 26, 1996

[30] Foreign Application Priority Data

Sep. 29, 1995 [JP] Japan .................................. 7-252168
Mar. 26, 1996 [JP] Japan .................................. 8-069532

[51] Int. Cl.[7] ........................................................ B32B 3/00
[52] U.S. Cl. ........................ 428/210; 428/328; 428/330; 428/331; 428/446; 428/457; 428/433; 428/209; 428/901; 257/703; 174/257; 174/258
[58] Field of Search ................................. 428/210, 209, 428/328, 330, 331, 446, 457, 433, 901; 174/280, 52.4, 257, 258; 257/703

[56] References Cited

U.S. PATENT DOCUMENTS

| | | | |
|---|---|---|---|
| 4,770,953 | 9/1988 | Horiguchi et al. | 428/210 |
| 4,800,137 | 1/1989 | Okuno et al. | 428/698 |
| 4,882,212 | 11/1989 | Singh Deo et al. | 428/210 |
| 5,001,089 | 3/1991 | Kasori et al. | 501/98.4 |
| 5,063,121 | 11/1991 | Sato et al. | 428/698 |
| 5,286,927 | 2/1994 | Ueno et al. | 174/257 |
| 5,294,750 | 3/1994 | Sakai et al. | 174/52.4 |

*Primary Examiner*—Deborah Jones
*Assistant Examiner*—Cathy F. Lam
*Attorney, Agent, or Firm*—Foley & Lardner

[57] ABSTRACT

A circuit board having at least one insulator layer and at least one conductor layer which includes at least one of the whole insulator layers in a sintered body containing $\beta\text{-}Si_3N_4$ as a main component and at least one element selected from the group consisting of a rare earth element and an alkaline earth element, and at least one of the whole conductor layers contains at least one element selected from the group of IVb, Vb and VIb group of the periodic table, and at least one element selected from the group of a rare earth element and an alkaline earth element, and a Si element.

17 Claims, 1 Drawing Sheet

CIRCUIT BOARD WITH HIGH STRENGTH AND HIGH RELIABILITY AND PROCESS FOR PREPARING THE SAME

BACKGROUND OF THE INVENTION

1. Field of the Invention

This invention relates to a circuit board with high strength and high reliability using a silicon nitride ($Si_3N_4$) sintered body as an insulating layer, a semiconductor device using the same and a process for preparing the same, particularly to a circuit board with high strength and high reliability having single layer wiring or multi-layer wiring obtained by integrally sintering an insulating layer(s) and a conductor layer(s).

2. Prior Art

Accompanying with miniaturization of electronic devices, it is an important problem of how to effectively dissipate exothermic heat from semiconductor elements mounted to a circuit board. Also, in the case of mounting semiconductor elements for electric power, heat dissipation is an important problem.

As an insulating material for a circuit board, $Al_2O_3$ ceramics has been widely used. Here, $Al_2O_3$ has a low thermal conductivity which is at most 20 W/mK so that there is a problem in heat dissipation. Also, in Japanese Laid-Open Patent Publication (Kokai) No. 178688/1985, application of AlN ceramics having excellent various electric characteristics such as electric insulating characteristics required as an insulator and excellent in thermal conductivity to a circuit board has been investigated.

However, AlN or $Al_2O_3$ is spoiled by thermal stress caused by exothermic heat from semiconductor elements and in AlN ceramics, there is a problem that the strength thereof is low as 300 MPa or so with the four points bending strength and when thermal stress is focused, crack will occur. This problem is not limited only to AlN, and in $Al_2O_3$, the same cracking phenomenon due to the reason of low strength of a sintered body can be observed. Also, AlN ceramics has poor chemical resistance such as water resistance, acid resistance and alkali resistance. Further, when external terminals such as pins, leads or balls are connected with the ceramics by a metal such as a silver wax or solder, it has a problem that the connecting portions are likely broken due to a stress caused by the difference in a thermal expansion coefficient between the ceramics and the metal.

A ceramics substrate in which the above problems are substantially overcome has been disclosed in Japanese Laid-Open Patent Publication (Kokai) No. 212441/1992. This ceramics substrate is mainly composed of $Si_3N_4$, and has high heat dissipation property than an alumina substrate and is excellent in environmental resistance, mechanical strength and electric characteristics.

On the other hand, when miniaturization and high density assembly of an electronic device are considered, high density assembly is also required for wiring of a circuit board and multi-layered constitution is essential technique. However, the conventional multi-layered technique is to integrally sinter $Al_2O_3$ ceramic insulator layers or AlN ceramic insulator layers with conductor layers, and a technique for making multi-layer of $Si_3N_4$ ceramic layers and conductor layers has not yet been established. Also, in the conventional technique for making multi-layer, a conductor layer suitable for a $Si_3N_4$ ceramic layer has not yet been developed. Thus, in a circuit board or a semiconductor device produced by the multi-layered technique, there are problems of a highly resistant conductor layer, or low dimensional precision, occurrence of warpage, burn out or peeling of a conductor circuit due to mismatching in shrinkage factors between an insulator layer and the conductor layer.

SUMMARY OF THE INVENTION

An object of the present invention is to provide a circuit board, which comprises a $Si_3N_4$ ceramic layer(s) and a low resistant conductor, having high strength and high reliability which are represented by high dimensional precision due to matching in shrinkage factors between an insulator layer and the conductor layer, by firm adhesiveness between the conductor layer and the insulator layer and by hardly occurring warpage or burn out, a semiconductor device using the same, and a process for preparing the high strength and high reliability circuit board, particularly to provide a high strength and high reliability circuit board having single layer wiring or multilayer wiring obtained by simultaneous sintering, by improving the conductor layer.

The present inventors have found that
  a circuit board having at least one insulator layer and at least one conductor layer which comprises
    at least one of the whole insulator layers is a sintered body containing $\beta$-$Si_3N_4$ as a main component and at least one element selected from the group consisting of a rare earth element and an alkaline earth element, and
    at least one of the whole conductor layers contains at least one element selected from the group consisting of IVb, Vb and VIb group of the periodic table and at least one element selected from the group consisting of a rare earth element and an alkaline earth element;
  and a semiconductor device using the same can solve the above problems.

Also, the present inventors have found that
  a process for preparing a circuit board which comprises the steps of
    adding at least one element selected from the group consisting of a rare earth element and an alkaline earth element to $\alpha$-$Si_3N_4$ as a sintering aid and then sintering the mixture to form an insulator layer;
    adding at least one element selected from the group consisting of a rare earth element and an alkaline earth element to at least one element selected from the group consisting of IVb, Vb and VIb group of the periodic table to form a conductor layer; and
    simultaneously sintering the insulator layer(s) and the conductor layer(s) to form a circuit board can solve the above problems.

Further, the present inventors have found that a circuit board with high strength and high reliability having at least one insulator layer and at least one conductor layer which comprises
  at least one of the whole insulator layers is a sintered body containing $\beta$-$Si_3N_4$ as a main component and at least one element selected from the group consisting of a rare earth element and an alkaline earth element, and
  at least one of the whole conductor layers contains at least one of Mo and W as a main component and at least one element selected from the group consisting of VIII group of the periodic table;
and a semiconductor device using the same can solve the above problems. Also, among the whole conductor layers, at least one of which may further contain at least one element selected from the group consisting of a rare earth element and an alkaline earth element, and/or at least one of $Si_3N_4$ and AlN.

Moreover, the present inventors have found that a circuit board having at least one insulator layer and at least one conductor layer which comprises at least one of the whole insulator layers is a sintered body containing $\beta$-$Si_3N_4$ as a main component and at least one element selected from the group consisting of a rare earth element and an alkaline earth element, and at least one of the whole conductor layers contains at least one of Mo and W as a main component and further contains AlN;

and a semiconductor device using the same can solve the above problems.

Here, the phrase "at least one of the whole insulator layers is a sintered body containing $\beta$-$Si_3N_4$ as a main component" means that the content of $\beta$-$Si_3N_4$ contained in the insulator layer (at least one of insulator layers) is 50% by weight or more and 50% by volume or more.

That is, the total contents of components in the insulator layer other than $\beta$-$Si_3N_4$ such as $\alpha$-$Si_3N_4$, a grain boundary component(s) and a colorant component(s) are less than 50% by weight and less than 50% by volume.

Also, the phrase "at least one of the whole conductor layers contains at least one of Mo and W as a main component" means that the total contents of Mo and W contained in the conductor layer (at least one of conductor layers) is 50% by weight or more and 50% by volume or more. It is not necessary to contain both of Mo and W and one of Mo and W may be 0% by weight (0% by volume).

That is, the total contents of components in the conductor layer other than Mo and W such as $Si_3N_4$, AlN and a VIII group element(s) are less than 50% by weight and less than 50% by volume.

Furthermore, the present inventors have found that a process for preparing a circuit board which comprises the steps of adding at least one element selected from the group consisting of a rare earth element and an alkaline earth element to $\alpha$-$Si_3N_4$ as a sintering aid and then sintering the mixture to form an insulator layer;

adding at least one element selected from the group consisting of VIII group of the periodic table to at least one of Mo and w to form a conductor layer; and simultaneously sintering the insulator layer(s) and the conductor layer(s) to form a circuit board can solve the above problems.

As described above, in the $Si_3N_4$ ceramic circuit board according to the present invention, there are many advantages that an insulator layer has high thermal conductivity, adhesiveness of a conductor layer is strong and firm, deformation of the board during the sintering step is little, and also tensile strength shows a sufficiently practicable characteristic value, resistivity of the conductor layer(s) is low and dimensional precision is high whereby its industrial value is extremely large.

DESCRIPTION OF THE PREFERRED EMBODIMENTS

Figure 1:
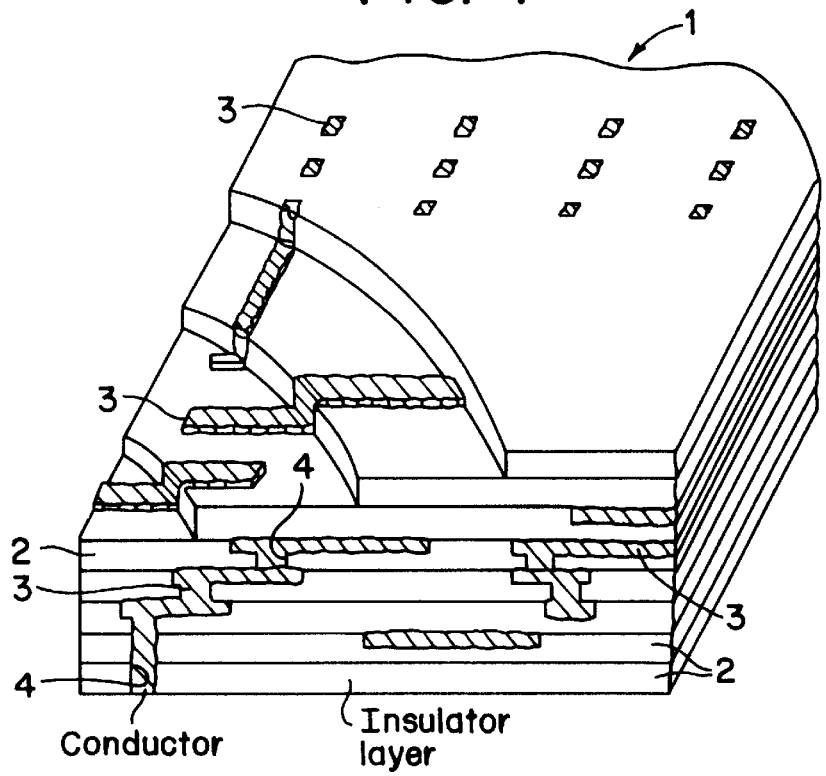
FIG. 1 is a partial cutout perspective view showing a multi-layer ceramic circuit board according to the present invention.

First, an insulator layer in the circuit board according to the present invention is explained.

The insulator layer is a polycrystalline sintered body comprising $\beta$-$Si_3N_4$ as a main component. Strength of the insulator layer is preferably 700 MPa or more, and by optimizing the composition and sintering conditions, strength is more preferably made 1,000 MPa or more.

Also, thermal conductivity is preferably 30 W/mK or more which is higher than that of alumina, more preferably 70 W/mK or more. For example, an insulator layer having a thermal conductivity of 70 W/mK or more can be obtained by using a raw powder of $Si_3N_4$ containing less amount of oxygen and/or by further adding $Al_2O_3$ or $SiO_2$ thereto. When $Al_2O_3$ or $SiO_2$ is added, an amount thereof to be added is preferably 0.8% by weight or less, more preferably 0.25% by weight or less. When optimization is carried out within the range in which those skilled in the art can be carried out easily, a $Si_3N_4$ insulator layer having a thermal conductivity of 130 W/mK or more can be obtained.

Next, the preparation process of the insulator layer is explained. First, a $Si_3N_4$ green sheet is prepared. This green sheet can be prepared by using a mixture of $Si_3N_4$ powder, sintering aid(s), binder(s), etc. with a dispersion which are sufficiently mixed and by applying it to a doctor blade method or the like.

There is no limitation about $Si_3N_4$ powder to be used, but in view of the thermal conductivity of the insulator layer, $\alpha$-$Si_3N_4$ powder having an oxygen content of 3.0% by weight or less is preferably used. More preferably, the oxygen content is less than 2.0% by weight, further preferably less than 1.5% by weight based on the total weight of the $Si_3N_4$ powder. If the amount of oxygen in the sintered body becomes small, thermal conductivity thereof becomes high.

Also, the $Si_3N_4$ powder to be used is preferably powder with a finer uniform particle size and an average particle size thereof is preferably less than 2 $\mu$m, more preferably less than 1 $\mu$m, further preferably less than 0.8 $\mu$m. Particularly, powder containing a particle size of less than 1 $\mu$m in an amount of 70% by volume or more is optimum. Also, as the $Si_3N_4$ raw powder, a crystallite type of an $\alpha$ type is preferably used, but $\beta$ type powder in an amount of less than 50% by weight can be used. Also, an amount of cation impurities is preferably less than 3,000 ppm, more preferably less than 1,500 ppm, particularly preferably less than 900 ppm. If cation impurities are contained in a large amount, a problem that a sintered body does not: have a high thermal conductivity will occur. An amount of anion impurities other than oxygen is preferably less than 2,000 ppm, more preferably less than 1,000 ppm, particularly preferably less than 500 ppm. If anion impurities other than oxygen are contained in a large amount as in the cation impurities, a problem that a sintered body does not have a high thermal conductivity will occur.

Next, as a sintering aid to be added, at least one element selected from a rare earth element and an alkaline earth element is added in the form of at least one of an element (single metal) and a compound containing the same. For example, there may be mentioned Sc, Y, La, Ce, Pr, Nd, Pm, Sm, Eu, Gd, Tb, Dy, Ho, Er, Tm, Yb, Lu, Be, Mg, Ca, Sr, Ba and the like. These rare earth elements and alkaline earth elements such as Y, Ce, La, Sc, Be and Mg contribute to make dense the $Si_3N_4$ ceramics and also contribute to heighten thermal conductivity by trapping oxygen in $Si_3N_4$ powder in a sub-constitutional phase of grain boundary. Particularly preferred elements are Y, Ce, La, Yb, Sc, Be and Mg since these elements have a larger effect in the above-mentioned point.

As the form of the compound containing the above elements, a form of an oxide is particularly preferred and a compound which becomes an oxide under sintering conditions may be also used. That is, a carbonate, a nitrate, an oxalate, a sulfate, a hydroxide, etc. may be used. Such a sintering aid may be added in the form of a halide, an acid halide, an acetylide compound, a carbide, a hydride, a nitride, a boride, a silicide, a sulfide, etc. other than the oxide. An optimum amount of these rare earth element and alkaline earth element to be added should be determined in view of an oxygen amount contained in a raw material powder, but it is preferably 0.01 to 15% by weight in terms of an oxide, more preferably 0.1 to 10% by weight, particularly preferably 1 to 8% by weight. Also, when both of compounds containing a rare earth element and an alkaline earth element are added or a composite compound containing both groups of elements is added, sintering can be carried out at a low temperature and a sintering starting temperature can be lowered at most 200° C.

Also, when a compound containing Si element is added as a supplemental additive for sintering, sinterability is sometimes improved so that it may be added depending on necessity. As a specific example thereof, when $SiO_2$ is added to $Si_3N_4$ raw powder containing less amount of oxygen for improving sintering property, dense sintered body can be easily obtained.

Also, when a compound containing Al element is added to an insulator layer, grain boundary components are crystallized so that $Si_3N_4$ sintered body with high strength can be obtained. For example, as such a compound, $Al_2O_3$ and AlN are mentioned. When AlN is added to a conductor layer, adhesiveness with a grain boundary component(s) of the insulator layer is heightened so that adhesiveness between the insulator layer and the conductor layer is heightened. In this case, when a rare earth element and an alkaline earth element is added to $Si_3N_4$ with the above compound, more excellent effect can be obtained. An amount of AlN to be added is preferably 0.005 to 0.2% by weight.

Further, the circuit board is sometimes required to be colored depending on the purpose, i.e., required to have light shielding property. In this case, when at least one element selected from the group consisting of IVb, Vb, VIb, VIIb and VIII group element of the periodic table or a compound thereof is added, light-shielding from near ultraviolet region to infrared region can be carried out. Preferred amount to be added is in terms of element 0.03 to 5% by weight, more preferably 0.1 to 3% by weight, particularly preferably 0.2 to 1% by weight.

These additives such as sintering aids, etc. may be added to a raw powder before sintering. However, depending on the kind of additives, these may be added after sintering by means of impregnation, etc.

A binder to be used is preferably an organic polymer which decomposes at a temperature of 1,400° C. or lower. More specifically, there may be used one to three kinds or more of an oxygen-containing organic polymer material such as a poly(methyl methacrylate), poly(vinyl butyral), polyacrylate, poly(vinyl alcohol), cellulose acetate butyrate, cellulose or the like. The kind or amount of the binder, and an amount of a dispersion can be optionally determined depending on the characteristics of $Si_3N_4$ raw powder or a thickness of a green sheet to be formed. Also, removal of the binder can be carried out in a non-oxidizing atmosphere such as $N_2$, Ar, $H_2$, etc. Further, when an amount of carbon after removal of the binder is desired to be reduced, $H_2O$ may be contained.

When a green sheet containing $Si_3N_4$ powder, sintering aids and a binder is sintered, an insulator layer can be formed, and preferable sintering conditions will be mentioned below.

Next, a conductor layer in the circuit board according to the present invention is explained.

In the first embodiment of the present invention, conductor components in the conductor layer are not specifically limited, and they may be materials which endure sintering temperature of $Si_3N_4$ ceramics. Such materials may include preferably IVb, Vb or VIb group element of the periodic table in the form of single substance or in the form of a compound or a mixture of compounds containing the same or in the form of a composite compound containing these elements. More preferably, as a conductor material, a metal of Mo, W, Ti, Zr, Nb or Ta or a compound containing at least one of these elements may be additionally used. Of these, particularly preferred are Mo, W, Ti or Zr. Also, among the IVb, Vb and VIb group elements of the periodic table, different kind of elements may be added in the form of single substance or in the form of a compound or a mixture of compounds containing the same or in the form of a composite compound containing these elements. Moreover, a minute amount of a low melting point noble metal element (such as Au, Ag, Cu, Pt, Pd, etc.) may be added.

In the conductor layer, at least one element selected from the group consisting of an alkaline earth element and a rare earth element is contained. As the alkaline earth element and the rare earth element, there may be mentioned, for example, Sc, Y, La, Ce, Pr, Nd, Pm, Sm, Eu, Gd, Tb, Dy, Ho, Er, Tm, Yb, Lu, Be, Mg, Ca, Sr, and Ba. From industrial view point, Y, Ce, La, Yb, Sc, Be and Mg are particularly preferred. Also, a compound which becomes an oxide under the sintering conditions can be used, and a carbonate, a nitrate, an oxalate, a sulfate, a hydroxide, etc. may be used. Such an additive may be added in the form of a halide, an acid halide, an acetylide compound, a carbide, a hydride, a nitride, a boride, a silicide, a sulfide, etc. other than the oxide.

An amount of the element(s) selected from the rare earth element and alkaline earth element to be added to the conductor layer is preferably 0.01 to 15% by weight in terms of an oxide. If the amount is too much, conductivity of the conductor layer is lowered, while if it is too little, various effects such as preventing peeling of the conductor layer, preventing warpage of the circuit board, etc. cannot be obtained.

When Si and/or Al element(s) in the form of single substance or in the form of a compound or a mixture of compounds containing the same or in the form of a composite compound containing these elements is/are further added to the conductor layer, a dense conductor layer with a large relative density can be obtained as compared with the case where these are not added, and other effects that peeling of the conductor layer is prevented, warpage of the circuit board is prevented, or the like can be obtained. Such an additive forms an aluminate liquid phase or a silicate liquid phase during the simultaneous sintering. Further, during the simultaneous sintering, an aluminate liquid phase or a silicate liquid phase is also formed in an insulator layer. Thus, by the aluminate liquid phase or the silicate liquid phase being formed in the conductor layer, wicking of the liquid phase occurred in the insulator layer by the conductor layer is prevented so that compositional unevenness in the insulator layer due to the wicking action can be prevented and warpage of the circuit board can be also prevented. Addition of these materials may be carried out in the form of a mixture of compounds containing an element selected from the rare earth element and alkaline earth element or in the form of a composite compound with these element. In this case, the total amount of an element selected from the rare earth element and alkaline earth element, and a mixture of Si and/or Al element and/or a compound containing these elements (or in the form of a composite compound containing these elements) is preferably 0.05 to 20% by weight in terms of an oxide.

In the second embodiment of the present invention, the main component of the conductor layer is at least one of Mo and W, and at least one element selected from VIII group element of the periodic table is also contained.

When at least one of VIII group elements such as Ni. Co and Fe of the periodic table is added, sintering property of Mo and W which are main component of the conductor layer is markedly improved. This is because a liquid phase is formed in the conductor layer during sintering and sintering of Mo and W proceeds due to liquid phase sintering. These Ni, Co and Fe elements may be added in the form of metal powder or in the form of a compound containing the element. When it is added in the form of a compound, it is particularly preferred to add in the form of an oxide, but a compound which becomes an oxide during the sintering may be added. More specifically, there may be mentioned a carbonate, a nitrate, a hydroxide, a sulfate, etc. Also, it may be added in the form of other than the oxide, for example, a boride, a silicide, a hydride, a fluoride, a nitride, a carbide, a phosphide, a sulfide, etc.

An amount of VIII group element of the periodic table to be added is preferably within the range of 0.01 to 5% by weight in terms of a monoxide. If the amount is less than 0.01% by weight, a sufficient amount of a liquid phase is not formed in the conductor layer, so that sintering of Mo and W sometimes does not proceed sufficiently. As the result, at the point that a relative density of a conductor is low, sintering stops. Accordingly, due to low relative density and little shrinkage factor, mismatching in shrinkage factor between the insulator layer and the conductor layer occurs whereby the resulting circuit board becomes a board with warpage or low dimensional precision. Also, He-leak characteristic becomes poor. On the other hand, if it is added exceeding 5% by weight, an amount of the liquid phase formed during sintering becomes too much so that blister occurs in the conductor layer due to evaporation of the liquid phase and an alloy phase with high resistance occurs with a large amount whereby resistivity of the whole conductor becomes high in some cases. The amount to be added is more preferably 0.03 to 1% by weight, particularly preferably 0.05 to 0.6% by weight. When VIII group element is added within the range of 0.01 to 5% by weight, the relative density of the conductor layer becomes 90% or more and the resistivity becomes 50 $\mu\Omega$cm or less. If the conditions are optimized, a dense and low resistivity conductor having a relative density of 95% or more and a resistivity of 20 $\mu\Omega$cm or less can be obtained. When further optimized, a conductor with a low conductivity of 15 $\mu\Omega$cm or less can be obtained. A circuit board thus obtained has a dimensional precision at the respective portions of within ±1% since matching in shrinkage factors of the insulator layer and the conductor layer is attained, and when it is most optimized, it has a dimensional precision within ±0.5%. Further, occurrence of warpage can be prohibited, and a warpage amount becomes 20 $\mu$m/10 mm diagonal or less. When it is subjected to optimization, a warpage amount becomes as little as 5 $\mu$m/10 mm diagonal or so. Moreover, when a Ni plating is carried out to the conductor to which VIII group element of the periodic table is added, bonding strength between the conductor layer and a plating layer becomes a large value.

When a graininess of Mo or W powder to be used for forming a conductor of 1.5 $\mu$m or more is used in combination with VIII group element of the periodic table, a large effect can be obtained. Also, when a circuit board is prepared at a low sintering temperature of 1,750° C. or lower, if VIII group element of the periodic table is added, shrinkage of a conductor is promoted so that it is preferred.

Further, to the conductor layer, when $Si_3N_4$ which is a main component for the insulator layer is added as a co-material, matching between the shrinkage factor of the insulator layer portion and that of the conductor layer portion can be easily established. Since $Si_3N_4$ to be added is an insulator, addition thereof with a large amount leads to increment in resistivity of a conductor layer so that it is not preferred. On the other hand, when little amount of $Si_3N_4$ is added, the above-mentioned effect cannot be fully obtained for which it is not preferred. When the amount of the co-material is within the range of 0.1 to 10% by weight, the above-mentioned effect can be obtained. More preferably, it is within the range of 0.5 to 5% by weight, particularly preferably 1 to 3% by weight. In a circuit board in which a $Si_3N_4$ co-material is added, matching in shrinkage factors of an insulator layer and a conductor layer is established so that occurrence of warpage can be markedly restrained. Therefore, it is not necessary to carry out a procedure to reform warpage for removing warpage after sintering. As the results, dimensional precision can be made ±1% or less, and when the amount to be added is optimized, it can be easily made ±0.5% or less. Further, when the $Si_3N_4$ co-material is added to Mo and/or W conductor, shrinkage is promoted whereby it becomes a dense conductor so that a conductor with a low resistivity can be obtained.

In the conductor layer, at least one element selected from the group consisting of an alkaline earth element and a rare earth element may be further contained. When at least one of these elements or a compound thereof is added, a dense conductor which can be confirmed by a helium leak test can be obtained. As the alkaline earth element and the rare earth element, there may be mentioned, for example, Sc, Y, La, Ce, Pr, Nd, Pm, Sm, Eu, Gd, Tb, Dy, Ho, Er, Tm, Yb, Lu, Be, Mg, Ca, Sr, and Ba. From industrial view point, Y, Ce, La, Sc, Be and Mg are particularly preferred. Oxides of these element are particularly preferred, and a compound which becomes an oxide under the sintering conditions can be also used. A carbonate, a nitrate, an oxalate, a sulfate, a hydroxide, etc. may be also used.

Such an additive may be added in the form of a halide, an acid halide, an acetylide compound, a carbide, a hydride, a nitride, a boride, a silicide, a sulfide, etc. other than the oxide. An amount of the alkaline earth element and the rare earth element to be added to the conductor layer is preferably 0.01 to 15% by weight in terms of an oxide. If the amount is too much, conductivity of the conductor layer is lowered, while if it is too little, various effects such as preventing peeling of the conductor layer, preventing warpage of the circuit board, etc. cannot be sometimes obtained.

When Si and/or Al element(s) in the form of single substance or in the form of a compound or a mixture of compounds containing the same or in the form of a composite compound containing these elements is/are further added to the conductor layer, a dense conductor layer with a large relative density can be obtained as compared with the case where these are not added, and other effects that peeling of the conductor layer is prevented, warpage of the circuit board is prevented, bonding strength becomes to be higher, or the like can be obtained. As the compound containing Si element, there may be mentioned, for example, $SiO_2$, and as the compound containing Al element, $Al_2O_3$ can be mentioned.

Such an additive forms an aluminate liquid phase or a silicate liquid phase during the simultaneous sintering. Further, during the simultaneous sintering, an aluminate liquid phase or a silicate liquid phase is also formed in an insulator layer. Thus, by the aluminate liquid phase or the silicate liquid phase being formed in the conductor layer, wicking of the liquid phase occurred in the insulator layer by the conductor layer is prevented so that compositional unevenness in the insulator layer due to the wicking action can be prevented and warpage of the circuit board can be also prevented.

Also, an element selected from the group consisting of the IVb and Vb group elements of the periodic table may be contained in the form of single metal or a compound as a sub-conductor component. Moreover, a minute amount of a low melting point noble metal element (such as Au, Ag, Cu, Pt, Pd, etc.) may be added.

In the third embodiment of the present invention, the conductor layer comprises at least one of Mo and W as a main component(s) and further contains AlN. The conductor layer may further contain an alkaline earth element, a rare earth element, $Si_3N_4$ as a co-material, at least one element of Si and Al, and/or VIII group element of the periodic table, in the form of single substance or in the form of a compound or a mixture of compounds containing the same or in the form of a composite compound containing these elements, as mentioned in the first embodiment. Moreover, an element selected from the group consisting of the IVb and Vb group elements of the periodic table may be contained in the form of single metal or a compound as a sub-conductor component. Furthermore, a minute amount of a low melting point noble metal element (such as Au, Ag, Cu, Pt, Pd, etc.) may be added.

When AlN is added to the conductor layer, not only matching between the shrinkage factor of the insulator layer and that of the conductor layer becomes possible, but also increase in resistivity of the conductor layer can be restrained since no reaction occurs between AlN and W or Mo. However, addition of AlN with much amounts is not preferred since increase in resistivity will occur due to decrease in amount of the conductor components. When the amount of AlN to be added is within the range of 0.1 to 10% by weight, the above effects can be obtained. The amount of AlN is preferably 0.5 to 5% by weight, more preferably 1 to 3% by weight. In the circuit board to which AlN is added, matching in shrinkage factors of the insulator layer and the conductor layer is accomplished so that occurrence of warpage can be prevented. Therefore, it is not necessary to carry out a procedure to reform warpage for removing warpage after sintering. As the results, dimensional precision can be made ±1% or less. Also, the Mo or W conductor to which AlN is added becomes a dense conductor since shrinkage is progressed, and a conductor layer with a low resistivity can be obtained since no silicide compound, etc.

is formed. The resistivity becomes 30 $\mu\Omega$cm or less. When the conditions are optimized, a low resistivity conductor layer with 20 $\mu\Omega$cm or less can be obtained, and further optimized, that with 15 $\mu\Omega$cm or less can be obtained.

In the following, the process for preparing the circuit board of the present invention is described.

First, the process for preparing the circuit board according to the first embodiment of the present invention is described.

That is, powder which can maintain conductivity after simultaneous sintering, more specifically, powder of single metal or a compound of a IVb, Vb or VIb group element of the periodic table is pasted and the paste is applied on a $Si_3N_4$ green sheet with a desired pattern. To the green sheet, via hole(s) is/are previously formed by using a punching machine, etc. to fill out the conductive paste which becomes a conductor after sintering by a pressure or using a metal mask by means of printing fill. According to this via hole, electrical connection between the upper and lower conductor layers sandwiching the green sheet is carried out.

To the conductive paste, at least one of a rare earth element and an alkaline earth element, and, if necessary, Si and/or Al element is/are added, in the form of single substance or in the form of a compound or a mixture of compounds containing the same or in the form of a composite compound containing these elements.

When the Si element and/or Al element is/are added to single metal or a compound of a rare earth element in the form of a mixture, it is preferably added in such an amount that an aluminate or a silicate can be formed. For example, when alumina is added as a compound containing Al element, an amount of the alumina is preferably 0.03 to 10% by weight so as to form an aluminate, more preferably 0.05 to 5% by weight, particularly preferably 0.1 to 1% by weight. Also, when $SiO_2$ is added as a compound containing Si element, an amount of the $SiO_2$ is preferably 0.03 to 10% by weight so as to form a silicate, more preferably 0.05 to 5% by weight, particularly preferably 0.1 to 1% by weight.

Further, an element(s) selected from the rare earth element or alkaline earth element in the conductor layer is preferably used with the same kind of an element to be added as a sintering aid(s) for $Si_3N_4$ ceramics.

An aluminate or a silicate is formed in the insulator layer and the conductor layer even when a different kind of materials are used in both layers, but when the same kind of a material is used in both layers, the same kind of an aluminate or silicate is formed in the insulator layer and the conductor layer whereby unevenness in structure can be more effectively prevented and also the above-mentioned wicking can be prevented. Thus, warpage of the substrate can be further prevented.

When the above metal(s) is/are added to the via hole portions alone, in which a volume of the conductor would become large, in the form of single metal or a compound thereof, warpage of the substrate may be prevented. That is, depending on the size of the substrate or arrangement of the conductor layer determined by a design, a circuit board with a little warpage can be sometimes obtained when the above element(s) is added to at least part of the conductor layer(s).

A multi-layered green compact (molded material) in which a conductive paste containing the above-mentioned components is used is, after removal of a binder, subjected to a sintering step. This sintering step is not particularly limited and the publicly known sintering method carried out in silicon nitride can be used as such. As a material of a setter of a sintering furnace in which the compact is set and sintered, graphite, BN, AlN, etc. can be used. Of these, most preferred is a setter made of $Si_3N_4$. When this is used, a reaction (between the setter and a material to be sintered) which is likely occurred at a part of the sintered body is never occurred even when sintering is carried out at a high temperature, and a surface roughness after sintering becomes extremely small whereby a good circuit board can be obtained. The surface roughness becomes 1.0 μm or less with an average surface roughness Ra. In a sintered body having better surface, it becomes 0.5 μm or less, and in a best sintered body, it becomes 0.3 μm or less. In general, sintering is carried out under normal, elevated or reduced pressure in a non-oxidative atmosphere, such as a nitrogen atmosphere or an argon atmosphere at a temperature of 1,500° C. to 1,950° C. When the sintering temperature is set to a higher temperature, a silicide is partially formed but when the sintering temperature is set to 1,850° C. or lower, formation of a silicide becomes little. The temperature is more preferably 1,800° C. or lower, further preferably 1,750° C. or lower. The time required for the sintering may vary depending on various conditions such as the thickness of the compact to be sintered and a sintering temperature, etc., but it is generally selected from the range of 0.5 hour to 100 hours. These conditions are preferably determined by considering various conditions before sintering, then sintering is carried out based thereon.

In order to make the resulting $Si_3N_4$ circuit board high thermal conductivity, dense and high strength, it is preferred to set an average elevating temperature, particularly at a high temperature region of 1,000° C. or higher, to within the range of 1 to 40° C./min, more preferably 5 to 30° C./min, further preferably 8 to 25° C./min. By the above sintering, a $Si_3N_4$ insulator layer with a relative density of 95% or more can be obtained. A denser insulator layer of 98% or more, further 99% or more can be obtained by optimization.

The circuit board thus prepared according to the first embodiment of the present invention has the following characteristics.

First, this circuit board has an extremely small value in both sides parallelism and warpage or swell is extremely little so that for a circuit board having an extremely large number of external terminals (for example, 1,000 terminals or more), soldering connection for mounting the board can be easily carried out. The both sides parallelism showing the presence or absence of warpage or swell of the substrate is obtained by measuring the maximum value of the difference between the center portion and the peripheral portion per 10 cm of a diagonal line of the multi-layered circuit board sintered body as a standard. In this invention, the above value becomes an extremely small as 0.5 mm or less. In the case of a circuit board with a large surface area, mounting can be carried out when a substrate having the both sides parallelism of 0.3 mm or less is used.

Also, an internal resistance of the circuit board is good as the surface resistance and internal resistance being both 200 μΩcm or less. Also, when the conductor layer is formed by adding Si and/or Al element(s), a conductor with a high density and a low resistivity can be obtained and formation of a silicide can be restrained as well whereby a conductor with a low resistance can be obtained. According to the optimization, a circuit board having a resistivity of 50 μΩcm or less, and in some cases, that having a resistivity of 20 μΩcm or less can be obtained. Incidentally, as a method of restraining the formation of a silicide, AlN may be added into the conductor layer as a filler.

Further, a bonding strength of the insulator layer and the conductor layer in the circuit board becomes a value of 5 kg/2 mm×2 mm or more. If the value is less than 5 kg/2 mm×2 mm, when a pin is used as an external terminal, it is insufficient in a bonding strength and the pin is lost from the board. Particularly in the case of BGA (ball grid alley package), when the circuit board with a narrower pitch in ball distance is mounted on the surface of an organic material having a large thermal expansion such as a print wiring board, a more firm bonding strength is required. In this case, a conductor composition should be selected so that a circuit board has a bonding strength of 6 kg/2 mm×2 mm or more. By optimization, a circuit board having a bonding strength of 7 kg/2 mm×2 mm or more can be obtained.

Next, the process for preparing the circuit board according to the second embodiment of the present invention is described.

First, powder which can maintain conductivity after simultaneous sintering, more specifically, powder containing Mo and/or W as a main component(s) and at least one of single metal or a compound such as an oxide of a VIII group element of the periodic table is pasted and the paste is applied on a $Si_3N_4$ green sheet with a desired pattern. When making a paste, at least one element selected from IVb and Vb group element of the periodic table may be added as a subconductor component in the form of single substance or in the form of a compound or a mixture of compounds containing the same or in the form of a composite compound containing these elements. To the green sheet, via hole(s) is/are previously formed by using a punching machine, etc. to fill out the conductive paste which becomes a conductor after sintering by a pressure or using a metal mask by means of printing fill. According to this via hole, electrical connection between the upper and lower conductor layers sandwiching the green sheet is carried out.

To the conductive paste, $Si_3N_4$ or AlN ceramic powder may be added. Further, at least one of a rare earth element and an alkaline earth element, and, if necessary, Si and/or Al element(s) may be added, in the form of single substance or in the form of a compound or a mixture of compounds containing the same or in the form of a composite compound containing these elements.

Incidentally, even when $Si_3N_4$, etc. are added to the via hole portion alone, in which a volume of the conductor would become large, warpage of the substrate sometimes do not occur. That is, depending on the size of the substrate or an arrangement of the conductor layer determined by a design, a circuit board with little warpage can be obtained even when the above component(s) is added to at least part of the conductor layer.

When the Si element and/or Al element is/are added to in combination with single metal or a compound of a rare earth element in the form of a mixture, it is preferably added in such an amount that an aluminate or a silicate can be formed. For example, when alumina is added as a compound containing Al element, an amount of the alumina is preferably 0.03 to 10% by weight so as to form an aluminate, more preferably 0.05 to 5% by weight, particularly preferably 0.1 to 1% by weight. Also, when $SiO_2$ is added as a compound containing Si element, an amount of the $SiO_2$ is preferably 0.03 to 10% by weight so as to form a silicate, more preferably 0.05 to 5% by weight, particularly preferably 0.1 to 1% by weight.

An element(s) selected from the rare earth element or alkaline earth element in the conductor layer is preferably used with the same kind of an element to be added as a sintering aid(s) for $Si_3N_4$ ceramics.

Even when different kind of materials are used in the insulator layer and the conductor layer, an aluminate or a silicate is formed in both layers, but when the same kind of a material is used in both layers, the same kind of an aluminate or silicate is formed in the insulator layer or the conductor layer whereby unevenness in structure can be more effectively prevented and also wicking can be prevented. Thus, warpage of the substrate can be further prevented.

A multi-layered green compact (molded material) in which a conductive paste containing the above-mentioned components is used is, after removal of a binder, subjected to a sintering step. This sintering step is not particularly limited and the publicly known sintering method carried out in silicon nitride can be used as such. As a material of a setter of a sintering furnace in which the compact is set and sintered, graphite, BN, AlN, etc. can be used. Of these, most preferred is a setter made of $Si_3N_4$. When this is used, a reaction (between the setter and a material to be sintered) which is likely occurred at a part of the sintered body is never occurred even when sintering is carried out at a high temperature, and a surface roughness after sintering becomes extremely small whereby a good circuit board can be obtained. The surface roughness becomes 1.0 μm or less with an average surface roughness Ra. In a sintered body having better surface, it becomes 0.5 μm or less, and in a best sintered body, it becomes 0.3 μm or less. In general, sintering is carried out under normal, elevated or reduced pressure in a non-oxidative atmosphere, such as a nitrogen atmosphere or an argon atmosphere at a temperature of 1,350° C. to 1,950° C. When the sintering temperature is set to a higher temperature, a silicide is partially formed but when the sintering temperature is set to 1,850° C. or lower, formation of a silicide becomes little. The temperature is more preferably 1,800° C. or lower, further preferably 1,700° C. or lower. The time required for the sintering may vary depending on various conditions such as the thickness of the compact to be sintered and a sintering temperature, etc., but it is generally selected from the range of 0.5 hour to 100 hours. These conditions are preferably determined by considering various conditions before sintering, then sintering is carried out based thereon.

In order to make the resulting $Si_3N_4$ circuit board high thermal conductivity, dense and further high strength, it is preferred to set an average elevating temperature, particularly at a high temperature region of 1,000° C. or higher, to within the range of 1 to 40° C./min, more referably 5 to 30° C./min, further preferably 8 to 25° C./min. By the above sintering, a $Si_3N_4$ insulator layer with a relative density of 95% or more can be obtained. A denser insulator layer of 98% or more, further 99% or more can be obtained, by optimization.

The circuit board thus prepared according to the second embodiment of the present invention has the following characteristics.

First, this circuit board has an extremely small value in both sides parallelism and warpage or swell is extremely little so that for a circuit board having an extremely large number of external terminals (for example, 1,000 terminals or more), soldering connection for mounting the board can be easily carried out. When the both sides parallelism showing the presence or absence of warpage or swell of the substrate is obtained by measuring the maximum value of the difference between the center portion and the peripheral portion per 10 cm of a diagonal line of the multi-layered circuit board sintered body as a standard, it becomes an extremely small value of 0.2 mm or less. In the case of a circuit board with a large surface area, mounting can be carried out when a substrate having the both sides parallelism of 0.05 mm or less according to the present invention is used.

Also, an internal resistance of the circuit board is good as the surface resistance and internal resistance being both 50 4 μΩcm or less. According to further optimization, it becomes a value of 20 μΩcm or less. By forming a conductor layer with the addition of a VIII group element of the periodic table, a density of the conductor layer becomes high, formation of a silicide can be prevented and a conductor layer with a low, resistance can be prepared. As a method of restraining the formation of a silicide, AlN may be added into the conductor layer as a filler.

Further, when $Si_3N_4$ is added to the conductor layer, shrinkage behavior of the insulator layer and the conductor layer becomes substantially the same and matching in shrinkage factors is accomplished whereby a dimensional precision of within ±1% can be accomplished. In a further preferred material, a dimensional precision of within ±0.5% can be accomplished. In such a circuit board having the dimensional precision and evenness, mounting of flip-chip can be easily carried out.

Further, a bonding strength of the insulator layer and the conductor layer in the circuit board becomes a value of 5 kg/2 mm×2 mm or more. If the value is less than 5 kg/2 mm×2 mm, when a pin is used as an external terminal, it is insufficient in a bonding strength and the pin is lost from the board. Particularly in the case of BGA (ball grid alley package), when the circuit board with a narrower pitch in ball distance is mounted on the surface of an organic material having a large thermal expansion such as a print wiring board, a more firm bonding strength is required. In this case, a conductor composition should be selected so that a circuit board has a bonding strength of 6 kg/2 mm×2 mm or more. By optimization, a circuit board having a bonding strength of 7 kg/2 mm×2 mm or more can be obtained.

Next, the process for preparing the circuit board according to the third embodiment of the present invention is described.

First, powder which can maintain conductivity after simultaneous sintering, more specifically, powder containing Mo and/or W as a main component(s) and AlN powder is pasted and the paste is applied on a $Si_3N_4$ green sheet with a desired pattern. When making a paste, at least one element selected from IVb and Vb group element of the periodic table may be added as a subconductor component in the form of single substance or in the form of a compound or a mixture of compounds containing the same or in the form of a composite compound containing these elements. The conductor layer may further contain, as described in the second embodiment, at least one element selected from an alkaline earth element or a rare earth element, or $Si_3N_4$, Si or Al element as a co-material, or a VIII group element of the periodic table, in the form of single substance or in the form of a compound or a mixture of compounds containing the same or in the form of a composite compound containing these elements. At this time, to the green sheet, via hole(s) is/are previously formed by using a punching machine, etc. to fill out the conductive paste which becomes a conductor after sintering by a pressure or using a metal mask by means of printing fill. According to this via hole, electrical connection between the upper and lower conductor layers sandwiching the green sheet is carried out.

To the conductive paste, AlN ceramic powder is added.

Incidentally, even when AlN is added to the via hole portion alone in which a volume of the conductor would become large, warpage of the substrate may be prevented. That is, depending on the size of the substrate or an arrangement of the conductor layer determined by a design, a circuit board with little warpage can be obtained even when the above component(s) is added to part of the conductor layer(s).

When the Si element and/or Al element(s) is/are added to in combination with single metal or a compound of a rare earth element in the form of a mixture, it is preferably added in such an amount that an aluminate or a silicate can be formed. For example, when alumina is added as a compound containing Al element, an amount of the alumina is preferably 0.03 to 10% by weight so as to form an aluminate, more preferably 0.05 to 5% by weight, particularly preferably 0.1 to 1% by weight. Also, when $SiO_2$ is added as a compound containing Si element, an amount of the $SiO_2$ is preferably 0.03 to 10% by weight so as to form a silicate, more preferably 0.05 to 5% by weight, particularly preferably 0.1 to 1% by weight.

An element(s) selected from the rare earth element or alkaline earth element in the conductor layer is preferably used with the same kind of an element to be added as a sintering aid(s) for $Si_3N_4$ ceramics. This element also acts as a sintering aid for AlN in the conductor layer.

Even when different kind of materials are used in the insulator layer and the conductor layer, an aluminate or a silicate is formed in both layers, but when the same kind of a material is used in both layers, the same kind of an aluminate or silicate is formed in the insulator layer or the conductor layer whereby unevenness in structure can be more effectively prevented and also wicking can be prevented. Thus, warpage of the substrate can be further prevented.

A multi-layered-green compact (molded material) in which a conductive paste containing the above-mentioned components is used is, after removal of a binder, subjected to a sintering step. This sintering step is not particularly limited and the publicly known sintering method carried out in silicon nitride can be used as such. As a material of a setter of a sintering furnace in which the compact is set and sintered, graphite, BN, AlN, etc. can be used. Of these, most preferred is a setter made of $Si_3N_4$. When this is used, a reaction (between the setter and a material to be sintered) which is likely occurred at a part of the sintered body is never occurred even when sintering is carried out at a high temperature, and a surface roughness after sintering becomes extremely small whereby a good circuit board can be obtained. The surface roughness becomes 1.0 $\mu$m or less with an average surface roughness Ra. In a sintered body having better surface, it becomes 0.5 $\mu$m or less, and in a best sintered body, it becomes 0.3 $\mu$m or less. In general, sintering is carried out under normal, elevated or reduced pressure in a non-oxidative atmosphere, such as a nitrogen atmosphere or an argon atmosphere at a temperature of 1,350° C. to 1,950° C. When the sintering temperature is set to a higher temperature, a silicide is partially formed but when the sintering temperature is set to 1,850° C. or lower, formation of a silicide becomes little. The temperature is more preferably 1,800° C. or lower, further preferably 1,700° C. or lower. The time required for the sintering may vary depending on various conditions such as the thickness of the compact to be sintered and a sintering temperature, etc., but it is generally selected from the range of 0.5 hour to 100 hours. These conditions are preferably determined by considering various conditions before sintering, then sintering is carried out based thereon.

In order to make the resulting $Si_3N_4$ circuit board high thermal conductivity, dense and further high strength, it is preferred to set an average elevating temperature, particularly at a high temperature region of 1,000° C. or higher, to within the range of 1 to 40° C./min, more preferably 5 to 30° C./min, further preferably 8 to 25° C./min. By the above sintering, a $Si_3N_4$ insulator layer with a relative density of 95% or more can be obtained. A denser insulator layer of 98% or more, further 99% or more of the insulator layer can be obtained, by optimization.

The circuit board thus prepared according to the third embodiment of the present invention has the following characteristics.

First, this circuit board has an extremely small value in both sides parallelism and warpage or swell is extremely little so that in a circuit board having an extremely large number of external terminals (for example, 1,000 terminals or more), soldering connection for mounting the board can be easily carried out. When the both sides parallelism showing the presence or absence of warpage or swell of the substrate is obtained by measuring the maximum value of the difference between the center portion and the peripheral portion per 10 cm of a diagonal line of the multi-layered circuit board sintered body as a standard, it becomes an extremely small value of 0.2 mm or less. In the case of a circuit board with a large surface area, mounting can be carried out when a substrate having the both sides parallelism of 0.05 mm or less according to the present invention is used.

Also, an internal resistance of the circuit board is good as the surface resistance and internal resistance being both 30 $\mu\Omega$cm or less. According to optimization, it becomes a value of 20 $\mu\Omega$cm or less, and further optimization gives a value of 15 $\mu\Omega$cm or less. By forming a conductor layer with the addition of AlN powder, a density of the conductor layer becomes high, formation of a silicide can be prevented and a conductor layer with a low resistance can be prepared. Further, when $Si_3N_4$ is added to the conductor layer, shrinkage behavior of the insulator layer and the conductor layer becomes substantially the same and matching in shrinkage factors is accomplished whereby a dimensional precision of within ±1% can be accomplished. In a further preferred material, a dimensional precision of within ±0.5% can be accomplished.

In such a circuit board having the dimensional precision and evenness, mounting of flip-chip can be easily carried out.

Further, a bonding strength of the insulator layer and the conductor layer in the circuit board becomes a value of 5 kg/2 mm×2 mm or more. If the value is less than 5 kg/2 mm×2 mm, when a pin is used as an external terminal, it is insufficient in a bonding strength and the pin is lost from the board. Particularly in the case of BGA (ball grid alley package), when the circuit board with a narrower pitch in ball distance is mounted on the surface of an organic material having a large thermal expansion such as a print wiring board, a more firm bonding strength is required. in this case, a conductor composition sold be selected so that a circuit board has a bonding strength of 6 kg/2 mm×2 mm or more. By optimization, a circuit board having a bonding strength of 7 kg/2 mm×2 mm or more can be obtained.

Figure 2:
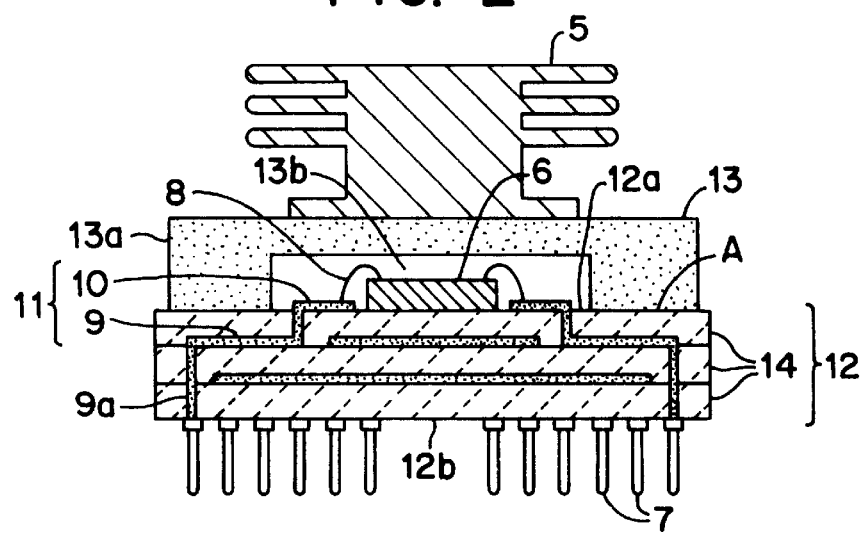
FIG. 2 is a drawing showing a semiconductor device (in the case where an external terminal is a lead pin) using a multi-layer ceramic circuit board according to the present invention.
Figure 3:
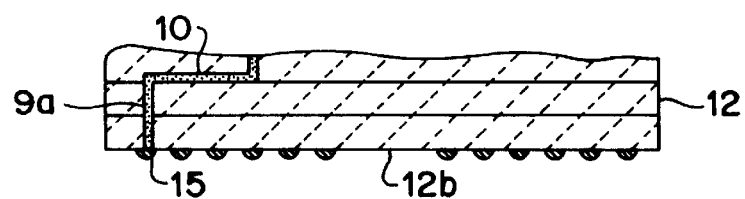
FIG. 3 is a partial sectional view showing a semiconductor device according to the present invention where an external terminal is a solder ball.

A preferred semiconductor device using the circuit board of the present invention will be explained by referring to FIG. 2 and FIG. 3. In this semiconductor device, a semiconductor element 6 such as ECL (a kind of the element is not particularly limited), etc. is placed on a substrate surface 12a, and a multi-layered ceramic circuit board 12 having a wiring pattern electrically connected with the semiconductor element, external terminals electrically connected with the above wiring pattern and formed on the substrate lower surface 12b of the multi-layered ceramic circuit board 12 and a high thermal conductivity encapsulating material 13 which is provided onto the substrate upper surface 12a of the multi-layered ceramic circuit board so as to cover the semiconductor element 6 are provided. However, the external terminals and the semiconductor device may be present at the same surface without any problem. Incidentally, the external terminals are preferably lead pins 7 as shown in FIG. 2 or may be solder balls 15 (BGA ball grid alley) as shown in FIG. 3. Si element is good in dimensional precision of a circuit board and also good in evenness so that mounting flip chip type can be easily carried out. Further, a high thermal conductivity encapsulating material is preferably formed by a silicon nitride or aluminum nitride sintered body or a metal (including an alloy), having a thermal conductivity of 100 W/mK or more.

According to the semiconductor device having the above constitution, heat occurred at the semiconductor element is efficiently transferred to a heat dissipation fin, etc. (in some cases, a fin may not necessarily be used) and excellent heat dissipation property can be revealed.

For constituting a semiconductor device, when a semiconductor element is placed on the other main surface of a silicon nitride circuit board opposed to the surface to which external terminals are connected, it can cope with a multi-pin and the semiconductor device can be minimized so that it is more preferred as a high speed semiconductor device. When temperature difference between the semiconductor is actuated and stopped is generated, a stress is applied to the pins of the external terminals or solder ball portions since an insulator layer of the circuit board is constituted by silicon nitride. However, it has high strength, so that problems such as crack, etc. do not occur. When a semiconductor device is constituted in the form of a multi-chip module (MCM) mounting many number of semiconductor elements on one circuit board, external terminals must be connected to a board with a wide surface area, but in this case, sufficient reliability in the point of resistance to thermal stress can be obtained.

EXAMPLES

The present invention is described in more detail by referring to Examples, but the present invention is not limited by these Examples.

Example 1

To $Si_3N_4$ powder having an average particle size of 0.6 μm which contains 95% by weight of α-$Si_3N_4$ and the reminder β-$Si_3N_4$ and contains 1.4% by weight of oxygen as an impurity were added 5% by weight of $Y_2O_3$ having an average particle size of 0.7 μm and 0.25% by weight of α-$Al_2O_3$ having an average particle size of 0.8 μm as sintering aids, and 0.3% by weight of $WO_3$ in terms of W metal as a colorant was added and the mixture was subjected to trituration by using balls made of $Si_3N_4$ for 24 hours to prepare a starting material. Then, an organic binder was dispersed into the starting material with an organic solvent to prepare a slurry. After defoaming the slurry, a uniform green sheet with a thickness of 100 to 800 μm was prepared by the doctor blade method. Next, this sheet was cut to the size of about 130 mm×130 mm and via holes which become a connection between respective layers of an electric circuit were opened by a punching machine with a size of 100 to 300 μm in diameter.

On the other hand, 97.0% by weight of tungsten having an average particle size of 1.1 μm, 1.71% by weight of $Y_2O_3$ having an average particle size of 0.7 μm and 1.29% by weight of $Al_2O_3$ having an average particle size of 0.8 μm were mixed and dispersed with an organic solvent to prepare a conductor paste to which an inorganic filler was added. This tungsten paste to which an inorganic filler was added was filled by using a press fitting machine on the green sheet in which via hole were formed, and a circuit in the same surface was printed by using a screen printing machine. A plural number of these sheets were laminated by pressing under heating. The laminate was cut to a size of 10 mm and then subjected to removal of a binder in $N_2+H_2+H_2O$ atmosphere at a maximum temperature of 900° C. Next, the resulting molded material subjected to removal of a binder was set to a $Si_3N_4$ setter and sintered under nitrogen atmosphere at a pressure of 10 atm at 1,850° C. for 3 hours to obtain a multi-layered ceramic substrate.

From a portion at which no conductor portion is present of the resulting substrate, a disc (10 mm in diameter and a thickness of 3.5 mm) was cut out as a test piece and a thermal conductivity of this disc was measured by the laser flash method.

Also, both sides parallelism which shows the presence or absence of warpage of the substrate was obtained by measuring the maximum value of the difference between the center portion and the peripheral portion of a diagonal line of the multi-layered circuit board sintered body as a standard.

Next, a sectional area of the conductor layer was calculated and from a resistance value, a conductor resistivity of the conductor layer was obtained. As for wiring on the surface, measurement was carried out without effecting metal plating on the conductor layer to examine the effect of addition of an inorganic tiller. Further, Ni plating was carried out at a conductor portion with an size of 2 mm×2 mm of the resulting substrate, soldered a wire and tensile strength test was carried out to measure bonding strength between the $Si_3N_4$ substrate and the conductor layer. These results are shown in Table 1 and Table 2.

Examples 2 to 47 and Comparative Examples 1 to 10

In the same manner as in Example 1 except for changing variously the kind and amount of $Si_3N_4$ powder, sintering aid powder for the $Si_3N_4$ substrate, the sintering aid filler and of a conductor material, and sintering conditions, $Si_3N_4$ multi-layered ceramic substrates were prepared, and thermal conductivity, tensile strength, both sides parallelism and surface resistance were measured with respect to each sample. The results are shown in Table 1 and Table 2. As clearly seen from Table 2, it can be found that in the circuit board according to the present invention, bonding strength of the conductor layer is improved.

For example, in Example 1, tensile strength was 6.8 kg/2 mm×2 mm whereas in Comparative example 1, it was 3.5 kg/2 mm×2 mm so that bonding strength was insufficient.

Also, it can be found that the simultaneous sintered body according to the present invention has a little warpage represented by the both sides parallelism and irrespective of containing additives, no increase was observed in specific resistance as compared with that of the material to which no additive was added.

TABLE 1

| | Insulator layer | | | | | | | | | | | Conductor layer | | | | | |
|---|---|---|---|---|---|---|---|---|---|---|---|---|---|---|---|---|---|
| | Si₃N₄ Powder | | | Sintering aid | | | Other additives | | | Colorant | | Conductor component | | | Inorganic filler | | |
| | Average particle size (μm) | Oxygen content (weight %) | Composition (weight %) | Kind | Average particle size (μm) | Composition (weight %) | Kind | Average particle size (μm) | Composition (weight %) | Kind | Composition in terms of metal (weight %) | Kind | Average particle size (μm) | Composition (weight %) | Kind | Average particle size (μm) | Composition (weight %) |
| Example 1 | 0.6 | 1.4 | 94.45 | Y₂O₃ | 0.7 | 5 | Al₂O₃ | 0.8 | 0.25 | WO₃ | 0.3 | W | 1.4 | 99 | Y₂O₃<br>Al₂O₃ | 0.7<br>0.8 | 0.67<br>0.33 |
| Example 2 | 2.0 | 1.0 | 94.70 | Y₂O₃<br>MgO | 0.7<br>1.0 | 3.0<br>1.0 | Al₂O₃<br>SiO₂ | 0.8<br>0.2 | 0.25<br>0.15 | WO₃ | 0.3 | W | 2.5 | 99 | Y₂O₃<br>MgO<br>Al₂O₃<br>SiO₂ | 0.7<br>1.0<br>0.8<br>0.2 | 0.40<br>0.10<br>0.20<br>0.10 |
| Example 3 | 1.1 | 1.2 | 95.60 | Y₂O₃ | 0.7 | 4 | SiO₂ | 0.2 | 0.10 | W | 0.3 | W | 2.0 | 99.2 | Y₂O₃<br>SiO₂ | 0.7<br>0.2 | 0.60<br>0.20 |
| Example 4 | 0.3 | 1.8 | 94.10 | Y₂O₃ | 0.7 | 4 | SiO₂<br>Al₂O₃<br>AlN | 0.2<br>0.8<br>0.6 | 0.10<br>0.25<br>0.20 | WO₃ | 0.3 | W | 0.4 | 99.2 | Y₂O₃<br>SiO₂<br>Al₂O₃<br>AlN | 0.7<br>0.2<br>0.8<br>0.6 | 0.50<br>0.10<br>0.10<br>0.10 |
| Example 5 | 0.05 | 2.0 | 92.4 | Y₂O₃<br>MgO | 0.7 | 5<br>2 | AlN | 0.3 | 0.30 | WO₃ | 0.3 | W | 0.2 | 98.6 | Y₂O₃<br>AlN<br>Al₂O₃<br>MgO | 0.7<br>0.6<br>0.2 | 0.80<br>0.20<br>0.20<br>0.20 |
| Example 6 | 0.6 | 1.4 | 94.45 | Sc₂O₃ | 0.9 | 5 | Al₂O₃ | 0.8 | 0.25 | Mo | 0.3 | W | 1.4 | 99 | Sc₂O₃<br>Al₂O₃ | 0.9<br>0.8 | 0.67<br>0.33 |
| Example 7 | 0.6 | 1.4 | 94.45 | La₂O₃ | 1.1 | 5 | Al₂O₃ | 0.8 | 0.25 | Mo | 0.3 | Mo | 2.0 | 99 | La₂O₃<br>Al₂O₃ | 1.1<br>0.8 | 0.80<br>0.15 |
| Example 8 | 0.6 | 1.4 | 94.45 | CeO₂ | 1.2 | 5 | Al₂O₃ | 0.8 | 0.25 | TiO₂ | 0.3 | TiC | 1.0 | 99 | CeO₂<br>SiO₂ | 1.2<br>0.2 | 0.05<br>0.90 |
| Example 9 | 0.6 | 1.4 | 94.45 | Pr₆O₁₁ | 1.0 | 5 | Al₂O₃ | 0.8 | 0.25 | TiO₂ | 0.3 | TiN | 1.0 | 99 | Pr₆O₁₁<br>AlN | 1.0<br>0.6 | 0.10<br>0.85 |
| Example 10 | 0.6 | 1.4 | 94.25 | Nd₂O₃ | 0.7 | 5 | Al₂O₃ | 0.8 | 0.25 | ZrO₂ | 0.5 | ZrN | 1.2 | 99 | Nd₂O₃<br>Al₂O₃<br>SiO₂ | 0.7<br>0.8<br>0.2 | 0.10<br>0.05<br>0.85 |
| Example 11 | 0.6 | 1.4 | 93.75 | Sm₂O₃ | 0.7 | 5 | Al₂O₃ | 0.8 | 0.25 | ZrN | 1.0 | ZrC | 1.1 | 99 | Sm₂O₃<br>Al₂O₃ | 0.7<br>0.8 | 0.10<br>0.85 |
| Example 12 | 0.6 | 1.4 | 89.75 | Eu₂O₃ | 0.7 | 5 | Al₂O₃ | 0.8 | 0.25 | HfC | 5.0 | HfC | 1.5 | 99 | Eu₂O₃<br>Al₂O₃<br>SiO₂ | 0.7<br>0.8<br>0.2 | 0.70<br>0.30<br>0.85 |
| Example 13 | 0.6 | 1.4 | 94.72 | Ga₂O₃ | 0.7 | 5 | Al₂O₃ | 0.8 | 0.25 | HfB₂ | 0.03 | HfN | 1.8 | 99 | Gd₂O₃<br>Al₂O₃<br>SiO₂ | 0.7<br>0.8<br>0.2 | 0.10<br>0.05<br>0.85 |
| Example 14 | 0.6 | 1.4 | 94.65 | Dy₂O₃ | 0.7 | 5 | Al₂O₃ | 0.8 | 0.25 | V₂O₅ | 0.1 | VN | 1.5 | 99 | Dy₂O₃<br>Al₂O₃ | 0.7<br>0.8 | 0.85<br>0.10 |

TABLE 1-continued

| | Insulator layer | | | | | | | | | | | | Colorant | | Conductor layer | | | | | |
|---|---|---|---|---|---|---|---|---|---|---|---|---|---|---|---|---|---|---|---|---|
| | Si₃N₄ Powder | | | Sintering aid | | | | | Other additives | | | | | | Conductor component | | | Inorganic filler | | |
| | Average particle size (μm) | Oxygen content (weight %) | Composition (weight %) | Kind | Average particle size (μm) | Composition (weight %) | Kind | Average particle size (μm) | Composition (weight %) | Kind | Composition (weight %) | Kind | Composition in terms of metal (weight %) | Kind | Average particle size (μm) | Composition (weight %) | Kind | Average particle size (μm) | Composition (weight %) |
| Example 15 | 0.6 | 1.4 | 93.85 | Ho₂O₃ | 0.7 | 5 | Al₂O₃ | 0.8 | 0.25 | NbN | 0.9 | NbN | 1.2 | 99 | SiO₂ | 0.2 | 0.05 |
| | | | | | | | | | | | | | | | Ho₂O₃ | 0.7 | 0.90 |
| | | | | | | | | | | | | | | | SiO₂ | 0.2 | 0.05 |
| Example 16 | 0.6 | 1.4 | 94.05 | Er₂O₃ | 0.7 | 5 | Al₂O₃ | 0.8 | 0.25 | TaN | 0.7 | TaN | 0.8 | 99 | Er₂O₃ | 0.7 | 0.90 |
| | | | | | | | | | | | | | | | SiO₂ | 0.2 | 0.10 |
| Example 17 | 0.6 | 1.4 | 91.75 | Yb₂O₃ | 0.7 | 5 | Al₂O₃ | 0.8 | 0.25 | MnO₂ | 3.0 | W | 1.4 | 99 | Yb₂O₃ | 0.7 | 0.85 |
| | | | | | | | | | | | | | | | SiO₂ | 0.2 | 0.05 |
| | | | | | | | | | | | | | | | AlN | 0.6 | 0.10 |
| Example 18 | 0.6 | 1.4 | 94.05 | Lu₂O₃ | 0.7 | 5 | Al₂O₃ | 0.8 | 0.25 | Mo₂B | 0.7 | TaC | 0.8 | 99 | Y₂O₃ | 0.7 | 0.85 |
| | | | | | | | | | | | | | | | SiO₂ | 0.2 | 0.05 |
| | | | | | | | | | | | | | | | Al₂O₃ | 0.8 | 0.10 |
| Example 19 | 0.6 | 1.4 | 95.45 | Y₂O₃ | 0.7 | 3.0 | Al₂O₃ | 0.8 | 0.25 | WO₃ | 0.3 | W | 1.4 | 99.2 | Y₂O₃ | 0.7 | 0.40 |
| | | | | | CaO | 1.0 | 1.0 | | | | | | | | CaO | 1.0 | 0.10 |
| | | | | | | | | | | | | | | | Al₂O₃ | 0.8 | 0.20 |
| | | | | | | | | | | | | | | | SiO₂ | 0.2 | 0.10 |
| Example 20 | 0.6 | 1.4 | 95.45 | Y₂O₃ | 0.7 | 3.0 | Al₂O₃ | 0.8 | 0.25 | WO₃ | 0.3 | W | 1.4 | 99.2 | Y₂O₃ | 0.7 | 0.40 |
| | | | | SrO | 1.0 | 1.0 | | | | | | | | | SrO | 1.0 | 0.10 |
| | | | | | | | | | | | | | | | Al₂O₃ | 0.8 | 0.20 |
| | | | | | | | | | | | | | | | SiO₂ | 0.2 | 0.10 |
| Example 21 | 0.6 | 1.4 | 95.45 | Y₂O₃ | 0.7 | 3.0 | Al₂O₃ | 0.8 | 0.25 | WO₃ | 0.3 | W | 1.1 | 99.2 | Y₂O₃ | 0.7 | 0.40 |
| | | | | BaO | 1.0 | 1.0 | | | | | | | | | BaO | 1.0 | 0.10 |
| | | | | | | | | | | | | | | | Al₂O₃ | 0.8 | 0.20 |
| | | | | | | | | | | | | | | | SiO₂ | 0.2 | 0.10 |
| Example 22 | 0.6 | 1.4 | 94.45 | Y₂O₃ | 0.7 | 3.0 | Al₂O₃ | 0.8 | 0.25 | WO₃ | 0.3 | W | 0.8 | 99.2 | Y₂O₃ | 0.7 | 0.40 |
| | | | | BeO | 1.0 | 1.0 | Al₂O₃ | | | | | | | | BeO | 1.0 | 0.10 |
| | | | | | | | | | | | | | | | Al₂O₃ | 0.8 | 0.20 |
| | | | | | | | | | | | | | | | SiO₂ | 0.2 | 0.10 |
| Example 23 | 0.6 | 1.4 | 94.75 | Y₂(CO₃)₃ | 1.0 | 5 | Al₂O₃ | 0.8 | 0.25 | — | — | W | 1.1 | 99 | Y₂O₃ | 0.7 | 0.80 |
| | | | | | | | | | | | | | | | Al₂O₃ | 0.8 | 0.15 |
| | | | | | | | | | | | | | | | SiO₂ | 0.2 | 0.05 |
| Example 24 | 0.6 | 1.4 | 95.75 | Y(NO₃)₃·6H₂O | — | 5 | Al₂O₃ | 0.8 | 0.25 | — | — | W | 1.4 | 99 | Y₂O₃ | 0.7 | 0.75 |
| | | | | | | | | | | | | | | | SiO₂ | 0.2 | 0.25 |
| Example 25 | 0.6 | 1.4 | 95.45 | YF₃ | 1.0 | 5 | Al₂O₃ | 0.8 | 0.25 | WO₃ | 0.3 | W | 1.4 | 99 | YF₃ | 1.0 | 0.70 |
| | | | | | | | | | | | | | | | Al₂O₃ | 0.8 | 0.30 |
| Example 26 | 0.6 | 1.4 | 95.45 | YB₆ | 1.0 | 5 | Al₂O₃ | 0.8 | 0.25 | W | 0.3 | W | 1.4 | 99 | YB₆ | 1.0 | 0.80 |
| | | | | | | | | | | | | | | | Al₂O₃ | 0.8 | 0.15 |
| | | | | | | | | | | | | | | | SiO₂ | 0.2 | 0.05 |
| Example 27 | 0.6 | 1.4 | 95.45 | YOF | 1.0 | 5 | Al₂O₃ | 0.8 | 0.25 | WO₃ | 0.3 | W | 1.4 | 99 | YOF | 1.0 | 0.70 |
| | | | | | | | | | | | | | | | Al₂O₃ | 0.8 | 0.30 |
| Example 28 | 0.6 | 1.4 | 95.45 | YN | 1.0 | 5 | Al₂O₃ | 0.8 | 0.25 | W | 0.3 | W | 1.4 | 99 | Y₂O₃ | 0.7 | 0.80 |

TABLE 1-continued

| | Insulator layer | | | | | | | | | | | Conductor layer | | | | | |
|---|---|---|---|---|---|---|---|---|---|---|---|---|---|---|---|---|---|
| | Si$_3$N$_4$ Powder | | | Sintering aid | | | Other additives | | | Colorant | | Conductor component | | | Inorganic filler | | |
| | Average particle size (μm) | Oxygen content (weight %) | Composition (weight %) | Kind | Average particle size (μm) | Composition (weight %) | Kind | Average particle size (μm) | Composition (weight %) | Kind | Composition in terms of metal (weight %) | Kind | Average particle size (μm) | Composition (weight %) | Kind | Average particle size (μm) | Composition (weight %) |
| Example 29 | 0.6 | 1.4 | 95.45 | YH$_3$ | 1.0 | 5 | Al$_2$O$_3$ | 0.8 | 0.25 | WO$_3$ | 0.3 | W | 1.4 | 99 | Al$_2$O$_3$ / SiO$_2$ | 0.8 / 0.2 | 0.15 / 0.05 |
| Example 30 | 0.6 | 3.0 | 89.60 | Y$_2$O$_3$ | 0.7 | 10 | — | — | — | WO$_3$ | 0.4 | W | 1.7 | 98 | Y$_2$O$_3$ / Al$_2$O$_3$ | 0.7 / 0.8 | 0.80 / 0.15 |
| Example 31 | 0.6 | 2.1 | 92.40 | Y$_2$O$_3$ | 0.7 | 7 | Al$_2$O$_3$ | 0.8 | 0.3 | WO$_3$ | 0.3 | W | 1.7 | 98.5 | Al$_2$O$_3$ / SiO$_2$ | 0.8 / 0.2 | 0.05 / 1.60 |
| Example 32 | 0.6 | 1.1 | 96.50 | Y$_2$O$_3$ | 0.7 | 3 | Al$_2$O$_3$ | 0.8 | 0.2 | WO$_3$ | 0.3 | W | 1.7 | 99.3 | Y$_2$O$_3$ / Al$_2$O$_3$ | 0.7 / 0.8 | 0.30 / 0.10 |
| Example 33 | 0.6 | 0.9 | 99.4 | Y$_2$O$_3$ | 0.7 | 0.5 | Al$_2$O$_3$ | 0.8 | 0.1 | — | — | W | 1.7 | 99.5 | Al$_2$O$_3$ / SiO$_2$ | 0.8 / 0.2 | 1.20 / 0.25 |
| Example 34 | 0.6 | 1.4 | 94.45 | Y$_2$O$_3$ | 0.7 | 5 | Al$_2$O$_3$ | 0.8 | 0.25 | TiN | 0.3 | W | 1.2 | 80 | Y$_2$O$_3$ / Al$_2$O$_3$ | 0.7 / 0.8 | 15.00 / 5.00 |
| Example 35 | 0.6 | 1.4 | 94.45 | Y$_2$O$_3$ | 0.7 | 5 | Al$_2$O$_3$ | 0.8 | 0.25 | TiN | 0.3 | W | 1.2 | 95 | Y$_2$O$_3$ / Al$_2$O$_3$ | 0.7 / 0.8 | 3.50 / 1.50 |
| Example 36 | 0.6 | 1.4 | 94.45 | Y$_2$O$_3$ | 0.7 | 5 | Al$_2$O$_3$ | 0.8 | 0.25 | TiN | 0.3 | W | 1.2 | 99.8 | Y$_2$O$_3$ / Al$_2$O$_3$ | 0.7 / 0.8 | 0.15 / 0.05 |
| Example 37 | 0.6 | 1.4 | 94.45 | Y$_2$O$_3$ | 0.7 | 5 | Al$_2$O$_3$ | 0.8 | 0.25 | TiN | 0.3 | W | 1.2 | 99.95 | Y$_2$O$_3$ / Al$_2$O$_3$ | 0.7 / 0.8 | 0.02 / 0.03 |
| Example 38 | 0.6 | 1.4 | 94.45 | Y$_2$O$_3$ | 0.7 | 5 | Al$_2$O$_3$ | 0.8 | 0.25 | WO$_3$ | 0.3 | W / Cu | 1.2 / 1.0 | 98 / 1.0 | Y$_2$O$_3$ / Al$_2$O$_3$ | 0.7 / 0.8 | 0.67 / 0.33 |
| Comparative ex. 1 | 0.6 | 1.4 | 94.45 | Y$_2$O$_3$ | 0.7 | 5 | Al$_2$O$_3$ | 0.8 | 0.25 | WO$_3$ | 0.4 | W | 1.4 | 100 | — | — | — |
| Comparative ex. 2 | 0.6 | 3.0 | 89.60 | Y$_2$O$_3$ | 0.7 | 10 | — | — | — | WO$_3$ | 0.3 | W | 1.7 | 100 | — | — | — |
| Comparative ex. 3 | 2.0 | 1.0 | 94.70 | Y$_2$O$_3$ / MgO / La$_2$O$_3$ | 0.7 / 1.0 / 1.1 | 3.0 / 1.0 / 5 | Al$_2$O$_3$ / SiO$_2$ / Al$_2$O$_3$ | 0.8 / 0.2 / 0.8 | 0.25 / 0.15 / 0.25 | Mo | 0.3 | Mo | 2.5 | 100 | — | — | — |
| Comparative ex. 4 | 0.6 | 1.4 | 94.45 | Yb$_2$O$_3$ | 0.7 | 5 | Al$_2$O$_3$ | 0.8 | 0.25 | MnO$_2$ | 3.0 | W | 2.0 | 100 | — | — | — |
| Comparative ex. 5 | 0.6 | 1.4 | 91.75 | Sm$_2$O$_3$ | 0.7 | 5 | Al$_2$O$_3$ | 0.8 | 0.25 | ZrN | 1.0 | ZrC | 1.4 | 100 | — | — | — |
| Comparative ex. 6 | 0.6 | 1.4 | 93.75 | Y$_2$O$_3$ | 0.7 | 5 | Al$_2$O$_3$ | 0.8 | 0.25 | TiN | 0.3 | W | 1.1 | 100 | — | — | — |
| Comparative ex. 7 | 0.6 | 1.4 | 94.45 | Y$_2$O$_3$ | 0.7 | 5 | Al$_2$O$_3$ | 0.8 | 0.25 | TiN | 0.3 | W | 1.2 | 100 | — | — | — |

TABLE 1-continued

| | Insulator layer | | | | | | | | | | | Conductor layer | | | | | |
|---|---|---|---|---|---|---|---|---|---|---|---|---|---|---|---|---|---|
| | Si₃N₄ Powder | | | Sintering aid | | | Other additives | | | Colorant | | Conductor component | | | Inorganic filler | | |
| | Average particle size (μm) | Oxygen content (weight %) | Composition (weight %) | Kind | Average particle size (μm) | Composition (weight %) | Kind | Average particle size (μm) | Composition (weight %) | Kind | Composition in terms of metal (weight %) | Kind | Average particle size (μm) | Composition (weight %) | Kind | Average particle size (μm) | Composition (weight %) |
| tive ex. 7 | | | | | | | | | | | | | | | | | |
| Example 39 | 0.6 | 1.4 | 94.2 | MgO | 0.7 | 5 | Al₂O₃ | 0.8 | 0.50 | WO₃ | 0.3 | W | 1.4 | 99 | MgO<br>Al₂O₃ | 0.7<br>0.8 | 0.90<br>0.10 |
| Example 40 | 0.6 | 1.4 | 94.2 | SrO | 0.7 | 5 | Al₂O₃ | 0.8 | 0.50 | WO₃ | 0.3 | W | 1.4 | 99 | SrO<br>Al₂O₃ | 0.7<br>0.8 | 0.90<br>0.10 |
| Example 41 | 0.6 | 1.4 | 94.45 | Y₂O₃<br>La₂O₃<br>MgO | 0.7<br>1.1<br>0.7 | 2<br>2<br>1 | Al₃O₃ | 0.8 | 0.25 | W | 0.3 | W | 1.4 | 99 | Y₂O₃<br>La₂O₃<br>MgO<br>Al₂O₃ | 0.7<br>1.1<br>0.7<br>0.8 | 0.34<br>0.33<br>0.10<br>0.23 |
| Example 42 | 0.6 | 1.4 | 94.45 | Y₂O₃<br>YF₃ | 0.7<br>0.7 | 4<br>1 | Al₂O₃ | 0.8 | 0.25 | WO₃ | 0.3 | W | 1.4 | 99 | Y₂O₃<br>YF₃<br>Al₂O₃<br>SiO₂ | 0.8<br>0.7<br>0.8<br>0.2 | 0.50<br>0.17<br>0.23<br>0.10 |
| Example 43 | 0.6 | 1.4 | 96.45 | MgO<br>SrO<br>CaO | 0.7<br>0.7<br>1.0 | 2.0<br>0.50<br>0.50 | Al₂O₃ | 0.8 | 0.25 | WO₃ | 0.3 | W | 1.4 | 99.4 | MgO<br>SrO<br>CaO<br>Al₂O₃ | 0.7<br>0.7<br>1.0<br>0.8 | 0.30<br>0.10<br>0.10<br>0.10 |
| Example 44 | 0.6 | 1.4 | 94.45 | Y₂O₃<br>LaB₆<br>MgO<br>CaB₆ | 0.7<br>1.3<br>0.7<br>1.2 | 3.50<br>0.25<br>1.00<br>0.25 | Al₂O₃ | 0.8 | 0.25 | WO₃ | 0.3 | W | 1.4 | 99.1 | Y₂O₃<br>LaB₆<br>MgO<br>CaB₆<br>Al₂O₃ | 0.7<br>1.3<br>0.7<br>1.2<br>0.8 | 0.60<br>0.05<br>0.10<br>0.05<br>0.10 |
| Example 45 | 0.6 | 1.4 | 96.45 | MgCO₃ | 0.7 | 3 | Al₂O₃ | 0.8 | 0.25 | WO₃ | 0.3 | W | 1.4 | 99.4 | MgCO₃<br>Al₂O₃ | 0.7<br>0.8 | 0.45<br>0.15 |
| Example 46 | 0.6 | 1.4 | 95.45 | Y₂O₃<br>MgCO₃ | 0.7<br>0.7 | 3<br>1 | Al₂O₃ | 0.8 | 0.25 | WO₃ | 0.3 | W | 1.4 | 99.2 | Y₂O₃<br>MgCO₃<br>Al₂O₃ | 0.7<br>0.7<br>0.8 | 0.50<br>0.20<br>0.10 |
| Example 47 | 0.6 | 1.4 | 95.45 | Y₂O₃<br>Mg(OH)₂ | 3.0<br>1.0 | 3<br>1 | Al₂O₃ | 0.8 | 0.25 | WO₃ | 0.3 | W<br>ZnN | 1.4<br>1.2 | 99.2 | Y₂O₃<br>Mg(OH)₂<br>Al₂O₃ | 0.7<br>1.0<br>0.8 | 0.50<br>0.20<br>0.10 |
| Comparative ex. 8 | 0.6 | 1.4 | 94.2 | MgO | 0.7 | 5 | Al₂O₃ | 0.8 | 0.50 | WO₃ | 0.3 | W | 1.4 | 100 | — | — | — |
| Comparative ex. 9 | 0.6 | 1.4 | 94.45 | Y₂O₃<br>La₂O₃ | 0.7<br>1.1 | 2<br>2 | Al₂O₃ | 0.8 | 0.25 | W | 0.3 | W | 1.4 | 100 | — | — | — |
| Comparative ex. 10 | 0.6 | 1.4 | 95.45 | Y₂O₃<br>MgCO₃ | 0.7<br>0.7 | 3<br>1 | Al₂O₃ | 0.8 | 0.25 | WO₃ | 0.3 | W | 1.4 | 100 | — | — | — |

TABLE 2

| | Sintering temperature (° C.) | Ambient gas | Pressure (atm.) | Retention time | Both sides parallelism (mm/diagonal) | Thermal conductivity (W/mk) | Conductor resistance ($\mu\Omega$cm) | Tensile strength (kg/2 mm$^\square$) |
|---|---|---|---|---|---|---|---|---|
| Example 1 | 1870 | $N_2$ | 10 | 6 | 0.1 | 110 | 17 | 7.5 |
| Example 2 | 1950 | $N_2$ | 10 | 100 | 0.2 | 150 | 20 | 7.0 |
| Example 3 | 1930 | $N_2$ | 10 | 20 | 0.2 | 130 | 19 | 6.9 |
| Example 4 | 1700 | $N_2$ | 1 | 0.5 | 0.3 | 60 | 23 | 6.0 |
| Example 5 | 1600 | $N_2$ | 0.5 | 10 | 0.5 | 30 | 29 | 5.0 |
| Example 6 | 1870 | $N_2$ | 10 | 6 | 0.2 | 50 | 25 | 5.9 |
| Example 7 | 1870 | $N_2$ 1 Ar 1 | 10 | 6 | 0.1 | 100 | 20 | 7.0 |
| Example 8 | 1870 | $N_2$ | 10 | 6 | 0.2 | 70 | 100 | 7.5 |
| Example 9 | 1900 | $N_2$ | 10 | 6 | 0.2 | 70 | 110 | 7.8 |
| Example 10 | 100 | $N_2$ | 8 | 6 | 0.2 | 75 | 40 | 7.0 |
| Example 11 | 1900 | $N_2$ | 8 | 6 | 0.2 | 75 | 60 | 6.9 |
| Example 12 | 1900 | $N_2$ | 8 | 6 | 0.2 | 80 | 70 | 6.6 |
| Example 13 | 1900 | $N_2$ | 10 | 6 | 0.2 | 80 | 75 | 6.8 |
| Example 14 | 1900 | $N_2$ | 10 | 6 | 0.2 | 80 | 90 | 5.3 |
| Example 15 | 1900 | $N_2$ | 10 | 6 | 0.2 | 85 | 180 | 6.3 |
| Example 16 | 1900 | $N_2$ | 10 | 6 | 0.2 | 85 | 140 | 6.8 |
| Example 17 | 1900 | $N_2$ | 10 | 6 | 0.3 | 60 | 18 | 7.2 |
| Example 18 | 1900 | Ar | 10 | 6 | 0.4 | 90 | 21 | 6.5 |
| Example 19 | 1850 | $N_2$ | 10 | 6 | 0.3 | 95 | 22 | 6.2 |
| Example 20 | 1850 | $N_2$ | 10 | 6 | 0.2 | 85 | 25 | 6.0 |
| Example 21 | 1850 | $N_2$ | 10 | 6 | 0.2 | 80 | 24 | 5.9 |
| Example 22 | 1870 | $N_2$ | 10 | 6 | 0.3 | 90 | 25 | 6.0 |
| Example 23 | 1870 | $N_2$ | 10 | 6 | 0.1 | 100 | 20 | 7.2 |
| Example 24 | 1870 | $N_2$ | 10 | 6 | 0.1 | 100 | 20 | 7.0 |
| Example 25 | 1870 | $N_2$ | 10 | 8 | 0.2 | 105 | 19 | 6.8 |
| Example 26 | 1870 | $N_2$ | 10 | 8 | 0.2 | 100 | 35 | 6.7 |
| Example 27 | 1870 | $N_2$ | 10 | 8 | 0.3 | 100 | 20 | 6.8 |
| Example 28 | 1870 | $N_2$ | 10 | 8 | 0.3 | 90 | 19 | 6.5 |
| Example 29 | 1870 | $N_2$ | 10 | 8 | 0.2 | 95 | 20 | 6.6 |
| Example 30 | 1850 | $N_2$ | 10 | 8 | 0.4 | 100 | 25 | 7.0 |
| Example 31 | 1870 | $N_2$ | 10 | 8 | 0.3 | 105 | 23 | 7.1 |
| Example 32 | 1870 | $N_2$ | 10 | 8 | 0.1 | 105 | 18 | 6.4 |
| Example 33 | 1870 | $N_2$ | 10 | 8 | 0.2 | 30 | 33 | 5.3 |
| Example 34 | 1870 | $N_2$ | 10 | 8 | 0.3 | 100 | 50 | 5.0 |
| Example 35 | 1870 | $N_2$ | 10 | 8 | 0.2 | 95 | 41 | 5.8 |
| Example 36 | 1870 | $N_2$ | 10 | 8 | 0.4 | 105 | 24 | 5.5 |
| Example 37 | 1870 | $N_2$ | 10 | 8 | 0.5 | 110 | 32 | 5.0 |
| Example 38 | 1870 | $N_2$ | 10 | 8 | 0.2 | 100 | 18 | 7.0 |
| Comparative example 1 | 1870 | $N_2$ | 10 | 6 | 0.9 | 105 | 22 | 3.8 |
| Comparative example 2 | 1850 | $N_2$ | 10 | 8 | 2.3 | 95 | 30 | 3.5 |
| Comparative example 3 | 1950 | $N_2$ | 10 | 100 | 1.5 | 130 | 25 | 3.5 |
| Comparative example 4 | 1870 | $N_2$ 1 Ar 1 | 10 | 6 | 1.0 | 95 | 25 | 3.3 |
| Comparative example 5 | 1900 | $N_2$ | 10 | 6 | 2.0 | 85 | 23 | 3.6 |
| Comparative example 6 | 1900 | $N_2$ | 8 | 6 | 1.6 | 70 | 80 | 3.4 |
| Comparative example 7 | 1870 | $N_2$ | 10 | 8 | 2.2 | 95 | 30 | 2.8 |
| Example 39 | 1870 | $N_2$ | 10 | 6 | 0.2 | 80 | 25 | 6.1 |
| Example 40 | 1870 | $N_2$ | 10 | 6 | 0.3 | 75 | 27 | 5.8 |
| Example 41 | 1870 | $N_2$ | 10 | 6 | 0.1 | 105 | 19 | 6.5 |
| Example 42 | 1870 | $N_2$ | 10 | 6 | 0.2 | 110 | 18 | 7.0 |
| Example 43 | 1870 | $N_2$ | 10 | 6 | 0.2 | 70 | 25 | 5.7 |
| Example 44 | 1870 | $N_2$ | 10 | 6 | 0.3 | 115 | 35 | 6.0 |
| Example 45 | 1870 | $N_2$ | 10 | 6 | 0.3 | 70 | 23 | 5.9 |
| Example 46 | 1870 | $N_2$ | 10 | 6 | 0.1 | 105 | 18 | 6.5 |
| Example 47 | 1870 | $N_2$ | 10 | 6 | 0.1 | 100 | 35 | 6.3 |
| Comparative example 8 | 1870 | $N_2$ | 10 | 6 | 1.8 | 75 | 30 | 3.1 |
| Comparative example 9 | 1870 | $N_2$ | 10 | 6 | 1.1 | 100 | 25 | 2.9 |
| Comparative example 10 | 1870 | $N_2$ | 10 | 6 | 1.0 | 100 | 24 | 3.2 |

Example 48

By using an insulator layer and a conductor layer having the same constitutions as in Example 2, a circuit board was prepared. This circuit board was a silicon nitride multi-layered circuit board with a size of 25 mm×25 mm×2.6 mm having internal wiring layers. On the other surface side of the silicon nitride multi-layered circuit board, 240 lead pins were connected by using Ag wax. Thereafter, a silicon element with a consumed electric power of 10 W was connected and mounted on the upper surface of the silicon nitride multi-layered circuit board as a semiconductor element, and bonding wire is provided to complete electric connection.

Further, by using a silicon nitride sintered body having a thermal conductivity of 150 W/mK, a high thermal conductivity encapsulating material which also acts as a heat dissipating member was prepared in the same manner as in preparing the insulator portion in Example 2. This material was provided onto the upper surface of the silicon nitride multi-layered circuit board by Au-Sn solder, and a heat dissipating fin having a diameter of 25 mm with a circular 7-step structure was provided onto the encapsulating material to obtain a desired semiconductor device.

For evaluating a heat dissipation property of the semiconductor device, a velocity of cooling wind was set to 1.5 m/s and thermal resistance was measured by the ΔVBE method. As the results, it was a low thermal resistant value as 2.7° C./W whereby it can be found that a semiconductor device having a high heat dissipation property can be obtained.

Comparative Example 11

In the same manner as in Example 48 except for using an alumina in the insulator layer, a semiconductor device was prepared but thermal resistance of this device was 8° C./W.

Example 49

$Si_3N_4$ powder having an average particle size of 0.6 μm which contains 95% of α-$Si_3N_4$ and the reminder β-$Si_3N_4$ and contains 1.4% by weight of oxygen as an impurity, $Y_2O_3$ having an average particle size of 0.6 μm and α-$Al_2O_3$ having an average particle size of 0.6 μm as sintering aids, and $WO_3$ as a colorant were formulated in amounts of 94.50:5.0:0.2:0.3 (% by weight) and the mixture was subjected to trituration by using balls made of $Si_3N_4$ for 24 hours to prepare a starting material. Then, an organic binder was dispersed into the starting material with an organic solvent to prepare a slurry. After defoaming the slurry, a uniform green sheet with a thickness of 100 to 800 μm was prepared by the doctor blade method. Next, this sheet was cut to the size of about 130 mm×130 mm and via holes which become a connection between respective layers of an electric circuit were opened by a punching machine with a size of 100 to 300 μm in diameter.

On the other hand, tungsten having an average particle size of 1.9 μm, NiO having an average particle size of 0.9 μm, $Si_3N_4$ powder having an average particle size of 0.6 μm with an oxygen amount of 1.4% by weight, and $Y_2O_3$ having an average particle size of 0.6 μm were formulated in amounts of 97.2:0.3:2.374:0.126 (% by weight), and mixed and dispersed with an organic solvent to prepare a conductor paste to which an inorganic filler was added. This tungsten paste to which an inorganic filler was added was filled by using a press fitting machine on the green sheet in which via holes were formed, and a circuit in the same surface was printed by using a screen printing machine. A plural number of these sheets were laminated by pressing under heating. The laminate was cut to a size of 100 mm×100 mm and then subjected to removal of a binder in $N_2+H_2+H_2O$ atmosphere at a maximum temperature of 900° C. Next, the resulting molded material subjected to removal of a binder was set to a $Si_3N_4$ setter and sintered under nitrogen atmosphere at a pressure of 10 atm at 1,800° C. for 12 hours to obtain a multi-layered ceramic substrate.

From a portion at which no conductor portion is present of the resulting substrate, a disc (10 mm in diameter and a thickness of 3.5 mm) was cut out as a test piece and a thermal conductivity of this disc was measured by the laser flash method. As the results, it showed a high thermal conductivity of 100 W/mK.

Also, both sides parallelism which shows the presence or absence of warpage of the substrate was obtained by measuring the maximum value of the difference between the center portion and the peripheral portion of a diagonal line of the multi-layered circuit board sintered body as a standard. The both sides parallelism obtained as a warpage amount per 10 cm was 0.04 mm.

Next, a sectional area of the conductor layer was calculated and from a resistance value, a conductor resistivity of the conductor layer was obtained. As for wiring on the surface, measurement was carried out without effecting metal plating on the conductor layer to examine the effect of addition of an inorganic filler. As the results, it showed an extremely low resistivity as 11 μΩcm. Further, Ni plating was carried out at a conductor portion with a size of 2 mm×2 mm of the resulting substrate, soldered a wire (pins) and tensile strength test was carried out to measure bonding strength between the $Si_3N_4$ substrate and the conductor layer. As the result, it was found that it has a sufficiently large tensile strength of 8.0 kg.

Examples 50 to 98 and Comparative Examples 12 to 21

In the same manner as in Example 49 except for changing variously the kinds and amounts of $Si_3N_4$ powder, sintering aid powder, other additives and colorants, the kinds and amounts of conductor components, the kinds and amounts of VIII group element and inorganic filler and sintering conditions as shown in Table 3, $Si_3N_4$ multi-layered ceramic substrates were prepared. Respective thermal conductivity, tensile strength, both sides parallelism and surface resistance were measured with respect to each sample. The results are shown in Table 4. As clearly seen from Table 4, it can be found that in the samples of Examples 50 to 92 according to the present invention, both sides parallelism is extremely small and conductor resistance is low as compared with those of Comparative examples, and bonding strength of the conductor layer is improved.

For example, in Example 50, tensile strength was 7.5 kg/2 mm×2 mm whereas in Comparative example 12, it was 2.4 kg/2 mm×2 mm so that marked difference can be observed in bonding strength. Also, it can be found from Table 4 that the simultaneous sintered body of Example 50 has little warpage and high dimensional precision. Also, this conductor layer contains additives, but NiO is contained as a VIII group additive so that relative density of the conductor layer was as high as 99% whereby it can be found that the specific resistance thereof is the same level as compared with the other Examples containing no additive.

TABLE 3

| | Insulator layer ||||||||| Colorant ||
| | Si₃N₄ Powder ||| Sintering aid ||| Other additives ||| Composition in ||
| | Average particle size (μm) | Oxygen content (weight %) | Composition (weight %) | Kind | Average particle size (μm) | Composition (weight %) | Kind | Average particle size (μm) | Composition (weight %) | Kind | terms of metal (weight %) |
|---|---|---|---|---|---|---|---|---|---|---|---|
| Example 49 | 0.6 | 1.4 | 94.50 | $Y_2O_3$ | 0.6 | 5.0 | $Al_2O_3$ | 0.6 | 0.20 | $WO_3$ | 0.3 |
| Example 50 | 1.8 | 1.1 | 95.30 | $Y_2O_3$<br>MgO | 0.7<br>1.0 | 3.0<br>1.0 | $Al_2O_3$<br>$SiO_2$ | 0.8<br>0.2 | 0.25<br>0.15 | $WO_3$ | 0.3 |
| Example 51 | 1.2 | 1.1 | 95.60 | $Y_2O_3$ | 0.7 | 4.0 | $SiO_2$ | 0.2 | 0.10 | W | 0.3 |
| Example 52 | 0.3 | 1.9 | 95.15 | $Y_2O_3$ | 0.5 | 4.0 | $SiO_2$<br>$Al_2O_3$<br>AlN | 0.2<br>0.8<br>0.6 | 0.10<br>0.25<br>0.20 | $WO_3$ | 0.3 |
| Example 53 | 0.04 | 2.0 | 92.4 | $Y_2O_3$<br>MgO | 0.7<br>0.7 | 5.0<br>2.0 | AlN | 0.3 | 0.30 | $WO_3$ | 0.3 |
| Example 54 | 0.6 | 1.5 | 94.45 | $Sc_2O_3$ | 0.9 | 5 | $Al_2O_3$ | 0.8 | 0.25 | Mo | 0.3 |
| Example 55 | 0.6 | 1.5 | 94.45 | $La_2O_3$ | 1.1 | 5 | $Al_2O_3$ | 0.8 | 0.25 | Mo | 0.3 |
| Example 56 | 0.7 | 1.4 | 94.45 | $CeO_2$ | 1.1 | 5 | $Al_2O_3$ | 0.8 | 0.25 | $TiO_2$ | 0.3 |
| Example 57 | 0.7 | 1.4 | 94.45 | $Pr_6O_{11}$ | 1.0 | 5 | $Al_2O_3$ | 0.8 | 0.25 | $TiO_2$ | 0.3 |
| Example 58 | 0.5 | 1.4 | 94.25 | $Nd_2O_3$ | 0.7 | 5 | $Al_2O_3$ | 0.8 | 0.25 | $ZrO_2$ | 0.5 |
| Example 59 | 0.5 | 1.4 | 93.75 | $Sm_2O_3$ | 0.7 | 5 | $Al_2O_3$ | 0.8 | 0.25 | ZrN | 1.0 |
| Example 60 | 0.5 | 1.5 | 89.75 | $Eu_2O_3$ | 0.6 | 5 | $Al_2O_3$ | 0.8 | 0.25 | HfC | 5.0 |
| Example 61 | 0.5 | 1.5 | 94.72 | $Gd_2O_3$ | 0.6 | 5 | $Al_2O_3$ | 0.8 | 0.25 | $HfB_2$ | 0.03 |
| Example 62 | 0.5 | 1.5 | 94.65 | $Dy_2O_3$ | 0.6 | 5 | $Al_2O_3$ | 0.8 | 0.25 | $V_2O_3$ | 0.1 |
| Example 63 | 0.5 | 1.5 | 93.85 | $Ho_2O_3$ | 0.6 | 5 | $Al_2O_3$ | 0.8 | 0.25 | NbN | 0.9 |
| Example 64 | 0.5 | 1.5 | 94.05 | $Er_2O_3$ | 0.6 | 5 | $Al_2O_3$ | 0.8 | 0.25 | TaN | 0.7 |
| Example 65 | 0.5 | 1.5 | 91.75 | $Yb_2O_3$ | 0.6 | 5 | $Al_2O_3$ | 0.8 | 0.25 | $MnO_2$ | 3.0 |
| Example 66 | 0.5 | 1.5 | 94.05 | $Lu_2O_3$ | 0.6 | 5 | $Al_2O_3$ | 0.8 | 0.25 | $Mo_2B$ | 0.7 |
| Example 67 | 0.5 | 1.5 | 95.45 | $Y_2O_3$<br>CaO | 0.6<br>1.0 | 3.0<br>1.0 | $Al_2O_3$ | 0.8 | 0.25 | $WO_3$ | 0.3 |
| Example 68 | 0.5 | 1.5 | 95.45 | $Y_2O_3$<br>SrO | 0.6<br>1.0 | 3.0<br>1.0 | $Al_2O_3$ | 0.8 | 0.25 | $WO_3$ | 0.3 |
| Example 69 | 0.5 | 1.5 | 95.45 | $Y_2O_3$<br>BaO | 0.9<br>1.0 | 3.0<br>1.0 | $Al_2O_3$ | 0.8 | 0.25 | $WO_3$ | 0.3 |
| Example 70 | 0.5 | 1.5 | 94.45 | $Y_2O_3$<br>BeO | 0.6<br>0.9 | 3.0<br>1.0 | $Al_2O_3$ | 0.7 | 0.25 | $WO_3$ | 0.3 |
| Example 71 | 0.5 | 1.5 | 94.75 | $Y_2(CO_3)_3$ | 0.9 | 5.0 | $Al_2O_3$ | 0.7 | 0.25 | — | — |
| Example 72 | 0.5 | 1.5 | 94.75 | $Y(NO_3)_3$-$6H_2O$ | — | 5.0 | $Al_2O_3$ | 0.7 | 0.25 | — | — |
| Example 73 | 0.5 | 1.4 | 95.45 | $YF_3$ | 0.9 | 5.0 | $Al_2O_3$ | 0.7 | 0.25 | $WO_3$ | 0.3 |
| Example 74 | 0.5 | 1.4 | 94.45 | $YB_6$ | 0.9 | 5.0 | $Al_2O_3$ | 0.7 | 0.25 | W | 0.3 |
| Example 75 | 0.5 | 1.4 | 94.45 | YOF | 0.9 | 5.0 | $Al_2O_3$ | 0.7 | 0.25 | $WO_3$ | 0.3 |
| Example 76 | 0.5 | 1.4 | 94.45 | YN | 0.9 | 5.0 | $Al_2O_3$ | 0.7 | 0.25 | W | 0.3 |
| Example 77 | 0.5 | 1.4 | 94.45 | $YH_3$ | 0.9 | 5.0 | $Al_2O_3$ | 0.7 | 0.25 | $WO_3$ | 0.3 |
| Example 78 | 0.5 | 2.8 | 89.60 | $Y_2O_3$ | 0.6 | 10.0 | — | — | — | $WO_3$ | 0.4 |
| Example 79 | 0.5 | 2.0 | 92.40 | $Y_2O_3$ | 0.6 | 7.0 | $Al_2O_3$ | 0.7 | 0.3 | $WO_3$ | 0.3 |
| Example 80 | 0.5 | 1.2 | 96.50 | $Y_2O_3$ | 0.6 | 3.0 | $Al_2O_3$ | 0.7 | 0.2 | $WO_3$ | 0.3 |
| Example 81 | 0.5 | 1.0 | 99.40 | $Y_2O_3$ | 0.6 | 0.5 | $Al_2O_3$ | 0.7 | 0.1 | — | — |
| Example 82 | 0.5 | 1.0 | 99.40 | $Y_2O_3$ | 0.6 | 0.5 | $Al_2O_3$ | 0.7 | 0.1 | TiN | 0.3 |

TABLE 3-continued

| | | | | | | | | | | | | |
|---|---|---|---|---|---|---|---|---|---|---|---|---|
| Example 82 | 0.5 | 1.5 | 94.45 | Y₂O₃ | 0.6 | 0.5 | Al₂O₃ | 0.8 | 0.25 | TiN | | 0.3 |
| Example 83 | 0.5 | 1.5 | 94.2 | MgO | 0.7 | 5 | Al₂O₃ | 0.8 | 0.50 | WO₃ | | 0.3 |
| Example 84 | 0.5 | 1.5 | 94.2 | SrO | 0.7 | 5 | Al₂O₃ | 0.8 | 0.25 | WO₃ | | 0.3 |
| Example 85 | 0.5 | 1.5 | 94.45 | Y₂O₃ / La₂O₃ / MgO | 0.7 / 1.1 / 0.6 | 2 / 2 / — | Al₂O₃ | 0.8 | 0.25 | W | | 0.3 |
| Example 86 | 0.5 | 1.5 | 94.45 | Y₂O₃ / YF₃ | 0.6 / 0.6 | 4 / 1 | Al₂O₃ | 0.8 | 0.25 | WO₃ | | 0.3 |
| Example 87 | 0.5 | 1.5 | 96.45 | MgO / SrO / CaO | 0.6 / 0.6 / 0.9 | 2 / 0.50 / 0.50 | Al₂O₃ | 0.8 | 0.25 | WO₃ | | 0.3 |
| Example 88 | 0.5 | 1.5 | 94.45 | Y₂O₃ / LaB₆ / MgO / CaB₆ | 0.7 / 1.2 / 0.6 / 1.0 | 3.50 / 0.25 / 1.00 / 0.25 | Al₂O₃ | 0.8 | 0.25 | WO₃ | | 0.3 |
| Example 89 | 0.5 | 1.5 | 96.45 | MgCO₃ | 0.7 | 3 | Al₂O₃ | 0.8 | 0.25 | WO₃ | | 0.3 |
| Example 90 | 0.5 | 1.5 | 95.45 | Y₂O₃ / MgCO₃ | 0.6 / 0.5 | 3 / 1 | Al₂O₃ | 0.8 | 0.25 | WO₃ | | 0.3 |
| Example 91 | 0.5 | 1.5 | 95.45 | Y₂O₃ / Mg(OH)₂ | 2.0 / 0.5 | 3 / 1 | Al₂O₃ | 0.8 | 0.25 | WO₃ | | 0.3 |
| Example 92 | 0.5 | 1.5 | 94.50 | Y₂O₃ | 0.6 | 5.0 | Al₂O₃ | 0.6 | 0.20 | WO₃ | | 0.3 |
| Example 93 | 0.4 | 1.8 | 95.15 | Y₂O₃ | 0.5 | 4.0 | SiO₂ / Al₂O₃ / AlN | 0.2 / 0.8 / 0.6 | 0.10 / 0.25 / 0.20 | WO₃ | | 0.3 |
| Example 94 | 0.5 | 1.4 | 94.50 | Y₂O₃ | 0.6 | 5.0 | Al₂O₃ | 0.6 | 0.20 | WO₃ | | 0.3 |
| Example 95 | 0.4 | 1.9 | 95.15 | Y₂O₃ | 0.5 | 4.0 | SiO₂ / Al₂O₃ / AlN | 0.2 / 0.8 / 0.6 | 0.10 / 0.25 / 0.20 | WO₃ | | 0.3 |
| Example 96 | 0.5 | 1.5 | 94.50 | Y₂O₃ | 0.6 | 5 | Al₂O₃ | 0.6 | 0.20 | WO₃ | | 0.3 |
| Example 97 | 0.4 | 1.8 | 95.15 | Y₂O₃ | 0.5 | 4.0 | SiO₂ / Al₂O₃ / AlN | 0.2 / 0.8 / 0.6 | 0.10 / 0.25 / 0.20 | WO₃ | | 0.3 |
| Comparative ex. 12 | 0.6 | 1.4 | 94.50 | Y₂O₃ | 0.6 | 0.5 | Al₂O₃ | 0.6 | 0.20 | WO₃ | | 0.3 |
| Comparative ex. 13 | 0.6 | 3.0 | 89.60 | Y₂O₃ | 0.6 | 10.5 | — | — | — | WO₃ | | 0.4 |
| Comparative ex. 14 | 1.8 | 1.1 | 95.30 | Y₂O₃ / MgO | 0.7 / 1.0 | 3.0 / 1.0 | Al₂O₃ / SiO₂ | 0.8 / 0.2 | 0.25 / 0.15 | WO₃ | | 0.3 |
| Comparative ex. 15 | 0.6 | 1.5 | 94.45 | La₂O₃ | 1.1 | 5 | Al₂O₃ | 0.8 | 0.25 | Mo | | 0.4 |
| Comparative ex. 16 | 0.5 | 1.5 | 91.75 | Yb₂O₃ | 0.6 | 5 | Al₂O₃ | 0.8 | 0.25 | MnO₂ | | 3.0 |
| Comparative ex. 17 | 0.5 | 1.4 | 93.75 | Sm₂O₃ | 0.7 | 5 | Al₂O₃ | 0.8 | 0.25 | ZrN | | 1.0 |
| Comparative ex. 18 | 0.5 | 1.5 | 94.45 | Y₂O₃ | 0.6 | 5 | Al₂O₃ | 0.8 | 0.25 | TiN | | 0.3 |
| Comparative ex. 19 | 0.5 | 1.5 | 94.2 | MgO | 0.7 | 5 | Al₂O₃ | 0.8 | 0.50 | WO₃ | | 0.3 |
| Comparative ex. 20 | 0.5 | 1.5 | 94.45 | Y₂O₃ / La₂O₃ / MgO | 0.7 / 1.1 / 0.6 | 2 / 2 / 1 | Al₂O₃ | 0.8 | 0.25 | W | | 0.3 |
| Comparative ex. 21 | 0.5 | 1.5 | 95.45 | Y₂O₃ / MgCO₃ | 0.6 / 0.6 | 3 / 1 | Al₂O₃ | 0.8 | 0.25 | WO₃ | | 0.3 |

| | | Conductor layer | | | | | | |
|---|---|---|---|---|---|---|---|---|
| | | Conductor component | | Inorganic filler | | | VIII Group additive | |
| | Kind | Average particle size (μm) | Composition (weight %) | Kind | Average particle size (μm) | Composition (weight %) | Kind | Average particle size (μm) | Composition (weight %) |
| Example 49 | W | 1.9 | 97.2 | Si₃N₄ / Y₂O₃ | 0.6 / 0.6 | 2.374 / 0.126 | NiO | 0.9 | 0.3 |
| Example 50 | W | 3.0 | 97.0 | Si₃N₄ / Y₂O₃ / MgO | 1.8 / 0.7 / 1.0 | 2.390 / 0.075 / 0.025 | NiO | 0.9 | 0.5 |
| Example 51 | W | 2.5 | 99.5 | — | — | — | NiO | 0.98 | 0.5 |
| Example 52 | Mo | 0.9 | 94.3 | Si₃N₄ / Y₂O₃ | 0.3 / 0.5 | 4.772 / 0.200 | NiO | 0.9 | 0.7 |

TABLE 3-continued

| | | | | | | | | | |
|---|---|---|---|---|---|---|---|---|---|
| | | | | $SiO_2$ | 0.2 | 0.005 | | | |
| | | | | $Al_2O_3$ | 0.8 | 0.013 | | | |
| | | | | AlN | 0.6 | 0.010 | | | |
| Example 53 | Mo | 0.7 | 94.0 | $Si_3N_4$ | 0.04 | 4.634 | NiO | 0.9 | 1.0 |
| | | | | $Y_2O_3$ | 0.7 | 0.251 | | | |
| | | | | MgO | 0.7 | 0.100 | | | |
| | | | | AlN | 0.3 | 0.015 | | | |
| Example 54 | W | 1.9 | 98.45 | $Si_3N_4$ | 0.6 | 1.187 | Ni | 1.0 | 0.3 |
| | | | | $Sc_2O_3$ | 0.9 | 0.063 | | | |
| Example 55 | Mo | 2.5 | 99.6 | — | — | — | Ni | 1.0 | 0.4 |
| Example 56 | W | 1.5 | 99.6 | — | — | — | Ni | 1.0 | 0.4 |
| Example 57 | W | 1.5 | 99.6 | — | — | — | Ni | 1.0 | 0.4 |
| Example 58 | W | 1.7 | 98.35 | $Si_3N_4$ | 0.5 | 1.184 | Ni | 1.0 | 0.4 |
| | | | | $Nd_2O_3$ | 0.7 | 0.063 | | | |
| | | | | $Al_2O_3$ | 0.8 | 0.003 | | | |
| Example 59 | W | 1.6 | 99.6 | — | — | — | CoO | 1.1 | 0.4 |
| Example 60 | W | 2.0 | 99.6 | — | — | — | CoO | 1.1 | 0.4 |
| Example 61 | W | 2.3 | 98.35 | $Si_3N_4$ | 0.5 | 1.187 | CoO | 1.1 | 0.4 |
| | | | | $Gd_2O_3$ | 0.6 | 0.063 | | | |
| Example 62 | W | 2.0 | 98.35 | $Si_3N_4$ | 0.5 | 1.184 | Co | 1.2 | 0.4 |
| | | | | $Dy_2O_3$ | 0.6 | 0.063 | | | |
| | | | | $Al_2O_3$ | 0.8 | 0.003 | | | |
| Example 63 | W | 1.7 | 99.6 | — | — | — | Co | 1.2 | 0.4 |
| Example 64 | W | 1.3 | 99.6 | — | — | — | co | 1.2 | 0.4 |
| Example 65 | W | 1.9 | 98.35 | $Si_3N_4$ | 0.5 | 1.184 | NiO | 0.7 | 0.4 |
| | | | | $Yb_2O_3$ | 0.6 | 0.064 | | | |
| | | | | $Al_2O_3$ | 0.8 | 0.003 | | | |
| Example 66 | W | 1.3 | 99.6 | — | — | — | Fe | 1.0 | 0.4 |
| Example 67 | W | 1.9 | 97.20 | $Si_3N_4$ | 0.5 | 2.393 | NiO | 0.7 | 0.3 |
| | | | | $Y_2O_3$ | 0.6 | 0.075 | | | |
| | | | | CaO | 1.0 | 0.025 | | | |
| | | | | $Al_2O_3$ | 0.8 | 0.006 | | | |
| Example 68 | Mo | 1.9 | 94.70 | $Si_3N_4$ | 0.5 | 4.799 | NiO | 0.7 | 0.3 |
| | | | | $Yb_2O_3$ | 0.6 | 0.151 | | | |
| | | | | SrO | 1.0 | 0.050 | | | |
| Example 69 | Mo | 1.6 | 99.7 | — | — | — | NiO | 0.7 | 0.3 |
| Example 70 | W | 1.5 | 97.2 | $Si_3N_4$ | 0.5 | 2.393 | NiO | 0.7 | 0.3 |
| | | | | $Y_2O_3$ | 0.6 | 0.075 | | | |
| | | | | BeO | 0.9 | 0.025 | | | |
| | | | | $Al_2O_3$ | 0.7 | 0.006 | | | |
| Example 71 | W | 1.6 | 99.6 | — | — | — | Ni | 1.0 | 0.4 |
| Example 72 | W | 1.9 | 99.6 | — | — | — | Ni | 1.0 | 0.4 |
| Example 73 | W | 1.9 | 97.3 | $Si_3N_4$ | 0.5 | 2.368 | CoO | 1.1 | 0.2 |
| | | | | $YF_3$ | 0.9 | 0.125 | | | |
| | | | | $Al_2O_3$ | 0.7 | 0.006 | | | |
| Example 74 | W | 1.9 | 99.8 | — | — | — | CoO | 1.1 | 0.2 |
| Example 75 | W | 1.9 | 99.8 | — | — | — | NiO | 0.7 | 0.2 |
| Example 76 | W | 1.9 | 99.8 | — | — | — | $Fe_2O_3$ | 0.9 | 0.2 |
| Example 77 | W | 1.9 | 97.3 | $Si_3N_4$ | 0.5 | 2.368 | $Fe_3O_4$ | 1.0 | 0.2 |
| | | | | $YH_3$ | 0.9 | 0.125 | | | |
| | | | | $Al_2O_3$ | 0.7 | 0.006 | | | |
| Example 78 | W | 2.2 | 97.4 | $Si_3N_4$ | 0.5 | 2.249 | FeO | 1.1 | 0.1 |
| | | | | $Y_2O_3$ | 0.6 | 0.251 | | | |
| Example 79 | Mo | 2.2 | 94.7 | $Si_3N_4$ | 0.5 | 4.634 | NiO | 0.7 | 0.3 |
| | | | | $Y_2O_3$ | 0.6 | 0.351 | | | |
| | | | | $Al_2O_3$ | 0.7 | 0.015 | | | |
| Example 80 | W | 2.2 | 97.2 | $Si_3N_4$ | 0.5 | 2.420 | NiO | 0.7 | 0.3 |
| | | | | $Y_2O_3$ | 0.6 | 0.074 | | | |
| | | | | $Al_2O_3$ | 0.7 | 0.005 | | | |
| Example 81 | W | 2.2 | 97.2 | $Si_3N_4$ | 0.5 | 2.485 | NiO | 0.7 | 0.3 |
| | | | | $Y_2O_3$ | 0.6 | 0.013 | | | |
| | | | | $Al_2O_3$ | 0.7 | 0.003 | | | |
| Example 82 | W | 1.7 | 99.7 | — | — | — | NiO | 0.7 | 0.3 |
| Example | W | 2.0 | 94.7 | $Si_3N_4$ | 0.5 | 4.737 | NiO | 0.7 | 0.3 |

TABLE 3-continued

| | | | | | | | | | |
|---|---|---|---|---|---|---|---|---|---|
| | 83 | Cu | 1.0 | | $Y_2O_3$ | 0.6 | 0.251 | | |
| | | | | | $Al_2O_3$ | 0.8 | 0.013 | | |
| Example 84 | | W | 1.9 | 97.1 | $Si_3N_4$ | 0.5 | 2.362 | CoO | 1.1 | 0.4 |
| | | | | | MgO | 0.7 | 0.125 | | |
| | | | | | $Al_2O_3$ | 0.8 | 0.013 | | |
| Example 85 | | W | 1.9 | 99.6 | — | — | — | Co | 1.2 | 0.4 |
| Example 86 | | W | 1.9 | 97.2 | $Si_3N_4$ | 0.5 | 2.368 | NiO | 0.7 | 0.3 |
| | | | | | $Y_2O_3$ | 0.7 | 0.050 | | |
| | | | | | $La_2O_3$ | 1.1 | 0.050 | | |
| | | | | | MgO | 0.6 | 0.025 | | |
| | | | | | $Al_2O_3$ | 0.8 | 0.006 | | |
| Example 87 | | W | 1.9 | 97.3 | $Si_3N_4$ | 0.5 | 2.368 | Ni | 1.0 | 0.2 |
| | | | | | $Y_2O_3$ | 0.6 | 0.100 | | |
| | | | | | $YF_3$ | 0.6 | 0.025 | | |
| | | | | | $Al_2O_3$ | 0.8 | 0.006 | | |
| Example 88 | | Mo | 1.9 | 99.7 | — | — | — | $Fe_3O_4$ | 1.0 | 0.3 |
| Example 89 | | Mo | 1.9 | 99.7 | — | — | — | NiO | 0.9 | 0.3 |
| Example 90 | | W | 1.9 | 99.7 | — | — | — | Ni | 1.0 | 0.3 |
| Example 91 | | W | 1.9 | 98.25 | $Si_3N_4$ | 0.5 | 1.197 | NiO | 0.9 | 0.5 |
| | | | | | $Y_2O_3$ | 0.6 | 0.038 | | |
| | | | | | MgCO | 0.6 | 0.013 | | |
| | | | | | $Al_2{}^3O_3$ | 0.8 | 0.003 | | |
| Example 92 | | Mo | 1.9 | 99.6 | — | — | — | NiO | 0.9 | 0.4 |
| Example 93 | | W | 1.9 | 99.574 | $Y_2O_3$ | 0.6 | 0.126 | NiO | 0.9 | 0.3 |
| Example 94 | | Mo | 0.9 | 99.272 | $Y_2O_3$ | 0.5 | 0.200 | NiO | 0.9 | 0.5 |
| | | | | | $SiO_2$ | 0.2 | 0.005 | | |
| | | | | | $Al_2O_3$ | 0.8 | 0.013 | | |
| | | | | | AlN | 0.6 | 0.010 | | |
| Example 95 | | W | 2.0 | 97.20 | $Si_3N_4$ | 0.5 | 0.5 | NiO | 0.9 | 0.3 |
| | | | | | AlN | 0.6 | 2.0 | | |
| Example 96 | | Mo | 1.0 | 98.80 | $Si_3N_4$ | 0.4 | 0.5 | NiO | 0.9 | 0.5 |
| | | | | | AlN | 0.6 | 2.0 | | |
| Example 97 | | W | 1.9 | 97.50 | AlN | 0.5 | 2.5 | — | — | — |
| Example 98 | | Mo | 0.9 | 97.50 | AlN | 0.6 | 2.5 | — | — | — |
| Comparative ex. 12 | | W | 1.9 | 100 | — | — | — | — | — | — |
| Comparative ex. 13 | | W | 2.2 | 100 | — | — | — | — | — | — |
| Comparative ex. 14 | | W | 3.0 | 100 | — | — | — | — | — | — |
| Comparative ex. 15 | | Mo | 2.5 | 100 | — | — | — | — | — | — |
| Comparative ex. 16 | | W | 1.9 | 100 | — | — | — | — | — | — |
| Comparative ex. 17 | | W | 1.6 | 100 | — | — | — | — | — | — |
| Comparative ex. 18 | | W | 1.7 | 100 | — | — | — | — | — | — |
| Comparative ex. 19 | | W | 1.9 | 100 | — | — | — | — | — | — |
| Comparative ex. 20 | | W | 1.9 | 100 | — | — | — | — | — | — |
| Comparative ex. 21 | | W | 1.9 | 100 | — | — | — | — | — | — |

TABLE 4

| | Sintering temperature (° C.) | Ambient gas | Pressure (atm.) | Retention time | Both sides parallelism (mm/diagonal) | Thermal conductivity (W/mk) | Conductor resistance ($\mu\Omega$cm) | Tensile strength (kg/2 mm□) |
|---|---|---|---|---|---|---|---|---|
| Example 49 | 1800 | $N_2$ | 10 | 12 | 0.04 | 100 | 11 | 8.0 |
| Example 50 | 1880 | $N_2$ | 10 | 100 | 0.08 | 140 | 14 | 7.5 |
| Example 51 | 1860 | $N_2$ | 10 | 40 | 0.13 | 120 | 13 | 6.6 |
| Example 52 | 1630 | $N_2$ | 1 | 1 | 0.12 | 55 | 17 | 6.5 |
| Example 53 | 1530 | $N_2$ | 0.5 | 20 | 0.20 | 30 | 23 | 5.5 |
| Example 54 | 1800 | $N_2$ | 10 | 12 | 0.08 | 45 | 19 | 6.4 |
| Example 55 | 1800 | $N_2$ 1 | 10 | 12 | 0.09 | 95 | 14 | 6.7 |

TABLE 4-continued

| | Sintering temperature (° C.) | Ambient gas | Pressure (atm.) | Retention time | Both sides parallelism (mm/diagonal) | Thermal conductivity (W/mk) | Conductor resistance ($\mu\Omega$cm) | Tensile strength (kg/2 mm²) |
|---|---|---|---|---|---|---|---|---|
| Example 56 | 1800 | Ar ï N$_2$ | 10 | 12 | 0.13 | 65 | 21 | 6.8 |
| Example 57 | 1830 | N$_2$ | 10 | 12 | 0.13 | 65 | 18 | 7.1 |
| Example 58 | 1830 | N$_2$ | 8 | 12 | 0.13 | 70 | 19 | 7.0 |
| Example 59 | 1830 | N$_2$ | 8 | 12 | 0.13 | 70 | 18 | 6.2 |
| Example 60 | 1830 | N$_2$ | 8 | 12 | 0.08 | 75 | 17 | 5.9 |
| Example 61 | 1830 | N$_2$ | 10 | 12 | 0.08 | 75 | 19 | 6.8 |
| Example 62 | 1830 | N$_2$ | 10 | 12 | 0.08 | 75 | 18 | 5.3 |
| Example 63 | 1830 | N$_2$ | 10 | 12 | 0.13 | 80 | 18 | 5.7 |
| Example 64 | 1830 | N$_2$ | 10 | 12 | 0.13 | 80 | 19 | 6.1 |
| Example 65 | 1830 | N$_2$ | 10 | 12 | 0.12 | 55 | 12 | 7.7 |
| Example 66 | 1830 | Ar | 10 | 12 | 0.20 | 85 | 23 | 5.9 |
| Example 67 | 1780 | N$_2$ | 10 | 12 | 0.12 | 90 | 16 | 6.7 |
| Example 68 | 1780 | N$_2$ | 10 | 12 | 0.08 | 80 | 19 | 6.5 |
| Example 69 | 1780 | N$_2$ | 10 | 12 | 0.13 | 75 | 18 | 5.6 |
| Example 70 | 1800 | N$_2$ | 10 | 12 | 0.12 | 85 | 19 | 6.5 |
| Example 71 | 1800 | N$_2$ | 10 | 12 | 0.09 | 95 | 14 | 6.9 |
| Example 72 | 1800 | N$_2$ | 10 | 12 | 0.09 | 95 | 14 | 6.7 |
| Example 73 | 1800 | N$_2$ | 10 | 16 | 0.08 | 100 | 13 | 7.3 |
| Example 74 | 1800 | N$_2$ | 10 | 16 | 0.13 | 95 | 29 | 6.4 |
| Example 75 | 1800 | N$_2$ | 10 | 16 | 0.17 | 95 | 14 | 6.5 |
| Example 76 | 1800 | N$_2$ | 10 | 16 | 0.17 | 85 | 13 | 6.2 |
| Example 77 | 1800 | N$_2$ | 10 | 16 | 0.08 | 90 | 14 | 7.1 |
| Example 78 | 1780 | N$_2$ | 10 | 16 | 0.16 | 95 | 19 | 7.5 |
| Example 79 | 1800 | N$_2$ | 10 | 16 | 0.12 | 100 | 17 | 7.6 |
| Example 80 | 1800 | N$_2$ | 10 | 16 | 0.04 | 100 | 12 | 6.9 |
| Example 81 | 1800 | N$_2$ | 10 | 16 | 0.08 | 30 | 27 | 5.8 |
| Example 82 | 1800 | N$_2$ | 10 | 16 | 0.17 | 95 | 40 | 5.0 |
| Example 83 | 1800 | N$_2$ | 10 | 16 | 0.08 | 95 | 12 | 7.5 |
| Example 84 | 1800 | N$_2$ | 10 | 12 | 0.08 | 75 | 19 | 6.6 |
| Example 85 | 1800 | N$_2$ | 10 | 12 | 0.17 | 70 | 21 | 5.5 |
| Example 86 | 1800 | N$_2$ | 10 | 12 | 0.04 | 100 | 13 | 7.0 |
| Example 87 | 1800 | N$_2$ | 10 | 12 | 0.08 | 100 | 12 | 7.5 |
| Example 88 | 1800 | N$_2$ | 10 | 12 | 0.13 | 65 | 19 | 5.4 |
| Example 89 | 1800 | N$_2$ | 10 | 12 | 0.17 | 105 | 29 | 5.7 |
| Example 90 | 1800 | N$_2$ | 10 | 12 | 0.17 | 65 | 17 | 5.6 |
| Example 91 | 1800 | N$_2$ | 10 | 12 | 0.04 | 100 | 12 | 7.0 |
| Example 92 | 1800 | N$_2$ | 10 | 12 | 0.09 | 95 | 29 | 6.0 |
| Example 93 | 1800 | N$_2$ | 10 | 10 | 0.17 | 95 | 13 | 7.5 |
| Example 94 | 1700 | N$_2$ | 10 | 10 | 0.18 | 60 | 18 | 6.0 |
| Example 95 | 1800 | N$_2$ | 10 | 12 | 0.16 | 100 | 12 | 7.7 |
| Example 96 | 1700 | N$_2$ | 10 | 12 | 0.17 | 65 | 17 | 6.1 |
| Example 97 | 1800 | N$_2$ | 10 | 16 | 0.18 | 105 | 11 | 7.8 |
| Example 98 | 1700 | N$_2$ | 10 | 16 | 0.19 | 70 | 16 | 6.3 |
| Comparative example 12 | 1800 | N$_2$ | 10 | 12 | 1.00 | 95 | 22 | 2.4 |
| Comparative example 13 | 1780 | N$_2$ | 10 | 16 | 2.40 | 90 | 38 | 2.3 |
| Comparative example 14 | 1880 | N$_2$ 1 Ar ï | 10 | 100 | 1.60 | 130 | 28 | 2.4 |
| Comparative example 15 | 1800 | N$_2$ 1 | 10 | 12 | 1.10 | 90 | 28 | 4.0 |
| Comparative example 16 | 1830 | N$_2$ | 10 | 12 | 2.10 | 50 | 24 | 2.3 |
| Comparative example 17 | 1830 | N$_2$ | 8 | 12 | 1.70 | 70 | 36 | 3.7 |
| Comparative example 18 | 1800 | N$_2$ | 10 | 16 | 2.30 | 90 | 70 | 3.0 |
| Comparative example 19 | 1800 | N$_2$ | 10 | 12 | 1.90 | 70 | 38 | 2.0 |
| Comparative example 20 | 1800 | N$_2$ | 10 | 12 | 1.20 | 95 | 26 | 2.1 |
| Comparative example 21 | 1800 | N$_2$ | 10 | 12 | 1.10 | 95 | 25 | 4.2 |

Example 99

By using an insulator layer and a conductor layer having the same constitutions as in Example 50, a silicon nitride multi-layered circuit board with a size of 25 mm×25 mm×2.6 mm having internal wiring layers was prepared. On the other surface side of the silicon nitride multi-layered circuit board, 240 lead pins were connected by using silver wax. Thereafter, a silicon element with a consumed electric power of 10 W was connected and mounted on the upper surface of the silicon nitride multi-layered circuit board as a semiconductor element, and bonding wire is provided to complete electric connection.

Further, by using a silicon nitride sintered body having a thermal conductivity of 150 W/mK, a high thermal conductivity encapsulating material which also acts as a heat dissipating member was prepared in the same manner as in preparing the insulator portion in Example 50. This material was provided on the upper surface of the silicon nitride multi-layered circuit board by Au-Sn solder, and a heat dissipating fin having a diameter of 25 mm with a circular 7-step structure was provided onto the encapsulating material to obtain a desired semiconductor device.

For evaluating a heat dissipation property of the semiconductor device, a wind velocity was set to 1.5 m/s and thermal resistance was measured by the ΔVBE method. As the results, it was a low thermal resistant value as 2.7° C./W whereby it can be found that a semiconductor device having a high heat dissipation property can be obtained.

Comparative Example 22

By using the same insulator layer and conductor layer constituted by the same starting materials as in Example 84 except for using an alumina in the insulator layer, a semiconductor device was prepared in the same manner as in Example 93. Thermal resistance of this semiconductor device was 8° C./W which value is extremely high as compared with that of Example 99.

We claim:

1. A circuit board having at least one insulator layer and at least one conductor layer wherein the circuit board comprises at least one of the insulator layers is a sintered body containing β-$Si_3N_4$ as a main component and at least one element selected from the group consisting of a rare earth element and an alkaline earth element, and at least one of the conductor layers contains at least one element selected from the group consisting of IVb, Vb and VIb group of the periodic table, at least one element selected from the group consisting of a rare earth element and an alkaline earth element, and a Si element.

2. The circuit board according to claim 1, wherein the insulator layer has a thermal conductivity of 30 W/mk or more.

3. The circuit board according to claim 1, wherein the rare earth element and the alkaline earth element are Sc, Y, La, Ce, Pr, Nd, Sm, Eu, Gd, Tb, Dy, Ho, Er, Tm, Yb, Lu, Be, Mg, Ca, Sr and Ba.

4. The circuit board according to claim 1, wherein the IVb, Vb and VIb group of the periodic table is Mo, W, Ti, Zr, Nb and Ta.

5. The circuit board according to claim 1, wherein the insulator layer further contains Al element.

6. The circuit board according to claim 1, wherein the conductor layer further contains an Al element.

7. The circuit board according to claim 1, wherein the conductor layer and the insulator layer contain a common element selected from the group consisting of the rare earth element and the alkaline earth element.

8. The circuit board according to claim 1, wherein at least one element selected from the group consisting of the rare earth element and the alkaline earth element contained in the insulator layer is contained in an amount of 0.01 to 15% by weight in terms of an oxide.

9. The circuit board according to claim 1, wherein at least one element selected from the group consisting of the rare earth element and the alkaline earth element contained in the conductor layer is contained in an amount of 0.01 to 15% by weight in terms of an oxide.

10. The circuit board according to claim 6, wherein the sum of at least one element selected from the group consisting of the rare earth element and the alkaline earth element, the Al element, and the Si element contained in the conductor layer is 0.05 to 20% by weight in terms of an oxide.

11. A semiconductor device which comprises a semiconductor element(s) mounted on the circuit board according to claim 1.

12. A circuit board having at least one insulator layer and at least one conductor layer wherein the circuit board comprises at least one of the insulator layers is a sintered body containing β-$Si_3N_4$ as a main component and at least one element selected from the group consisting of a rare earth element and an alkaline earth element, and at least one of the conductor layers contains at least one of Mo and W as a main component, at least one element selected from the group consisting of VIII group of the periodic table, and a Si element.

13. The circuit board according to claim 12, wherein at least one layer of the conductor layers further contains at least one element selected from the group consisting of a rare earth element and an alkaline earth element.

14. The circuit board according to claim 12, wherein at least one layer of the conductor layers further contains at least one of $Si_3N_4$ and AlN.

15. A semiconductor device which comprises a semiconductor element(s) mounted on the circuit board according to claim 12.

16. A circuit board having at least one insulator layer and at least one conductor layer wherein the circuit board comprises at least one of the insulator layers is a sintered body containing β-$Si_3N_4$ as a main component and at least one element selected from the group consisting of a rare earth element and an alkaline earth element, and at least one of the conductor layers contains at least one of Mo and as a main component and further contains AlN, and a Si element.

17. A semiconductor device which comprises a semiconductor element(s) mounted on the circuit board according to claim 16.

* * * * *